US009100019B2

(12) United States Patent
Akiyama

(10) Patent No.: US 9,100,019 B2
(45) Date of Patent: Aug. 4, 2015

(54) SEMICONDUCTOR DRIVER CIRCUIT AND POWER CONVERSION DEVICE

(71) Applicant: Hitachi, Ltd., Chiyoda-ku, Tokyo (JP)

(72) Inventor: Satoru Akiyama, Machida (JP)

(73) Assignee: Hitachi, Ltd., Tokyo (JP)

( * ) Notice: Subject to any disclaimer, the term of this patent is extended or adjusted under 35 U.S.C. 154(b) by 323 days.

(21) Appl. No.: 13/841,160

(22) Filed: Mar. 15, 2013

(65) Prior Publication Data

US 2013/0265029 A1    Oct. 10, 2013

(30) Foreign Application Priority Data

Apr. 5, 2012  (JP) .................................. 2012-086686

(51) Int. Cl.
*G05F 3/16* (2006.01)
*H03K 17/94* (2006.01)
(Continued)

(52) U.S. Cl.
CPC .............. *H03K 17/94* (2013.01); *H02M 3/158* (2013.01); *H03K 17/162* (2013.01); *H03K 2017/066* (2013.01)

(58) Field of Classification Search
CPC .......... H03K 17/102; H03K 19/00315; H03M 3/157; H02M 1/088
USPC .......... 327/143, 333, 382, 423, 430; 323/222, 323/224, 268, 282–290; 326/62, 68, 81, 83
See application file for complete search history.

(56) References Cited

U.S. PATENT DOCUMENTS 6,242,962 B1 * 6/2001 Nakamura ..................... 327/333
6,661,208 B2 * 12/2003 Rutter et al. ................... 323/224
(Continued)

FOREIGN PATENT DOCUMENTS

JP    2000-333441 A    11/2000
JP    2004-159424 A    6/2004
(Continued)

OTHER PUBLICATIONS

Das, Mrinal K., "Commercially Available Cree Silicon Carbide Power Devices: Historical Success of JBS Diodes and Future Power Switch Prospects", CS MANTECH Conference, May $16^{th}$-$19^{th}$, 2011, Palm Springs, CA, USA.
(Continued)

*Primary Examiner* — Rajnikant Patel
(74) *Attorney, Agent, or Firm* — Miles & Stockbridge P.C.

(57) ABSTRACT

In a power conversion device provided with a power semiconductor device and a semiconductor driver circuit for driving the power semiconductor device, false firing can be prevented, and improvement in reliability can be achieved. The power conversion device is provided with: a first switch element inserted between a power supply voltage and an output node; a second switch element inserted between a ground power supply voltage and the output node; and a gate driver circuit for controlling turning ON/OFF of the second switch element. When the second switch element is controlled to be turned OFF, the gate driver circuit drives a gate-source voltage at, for example, a level of 0 V. However, when the first switch element is shifted from an OFF state to an ON state at a first timing in a state that the gate-source voltage is driven at, for example, the level of 0 V, the gate driver circuit temporarily applies a level of a negative voltage as the gate-source voltage during a first period which crosses over the first timing.

20 Claims, 15 Drawing Sheets

(51) Int. Cl.
*H02M 3/158* (2006.01)
*H03K 17/16* (2006.01)
*H03K 17/06* (2006.01)

(56) References Cited

U.S. PATENT DOCUMENTS

| | | | |
|---|---|---|---|
| 6,906,552 B2* | 6/2005 | Ajit | 326/81 |
| 7,304,464 B2* | 12/2007 | Weng et al. | 323/285 |
| 7,388,404 B1* | 6/2008 | Miller | 326/82 |
| 7,782,098 B2 | 8/2010 | Hashimoto et al. | |
| 8,395,434 B1* | 3/2013 | Nguyen et al. | 327/333 |

FOREIGN PATENT DOCUMENTS

| | | |
|---|---|---|
| JP | 2009-021823 A | 1/2009 |
| JP | 2012-249399 A | 12/2012 |

OTHER PUBLICATIONS

Shen, Xiao, et al., "Atomic-scale origins of bias-temperature instabilities in SiC—SiO$_2$ structures", Applied Physics Letters 98, 2011, pp. 063507-1 to 063507-3.

Lelis, Aivars J., et al., "Time Dependence of Bias-Stress-Induced SiC MOSFET Threshold-Voltage Instability Measurements", IEEE Transactions on Electron Devices, vol. 55, No. 8, Aug. 2008, pp. 1835 to 1840.

* cited by examiner

FIG. 15
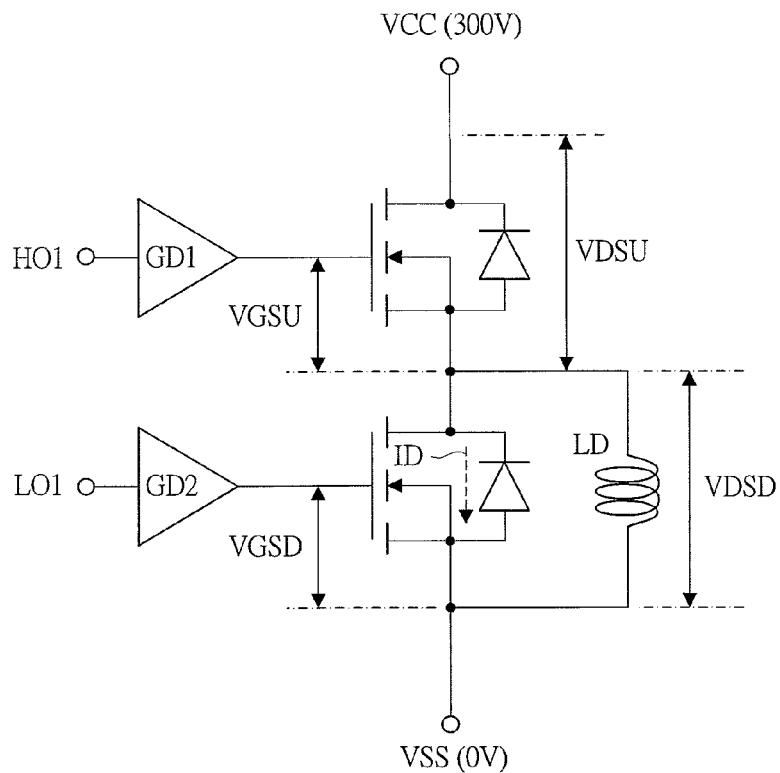
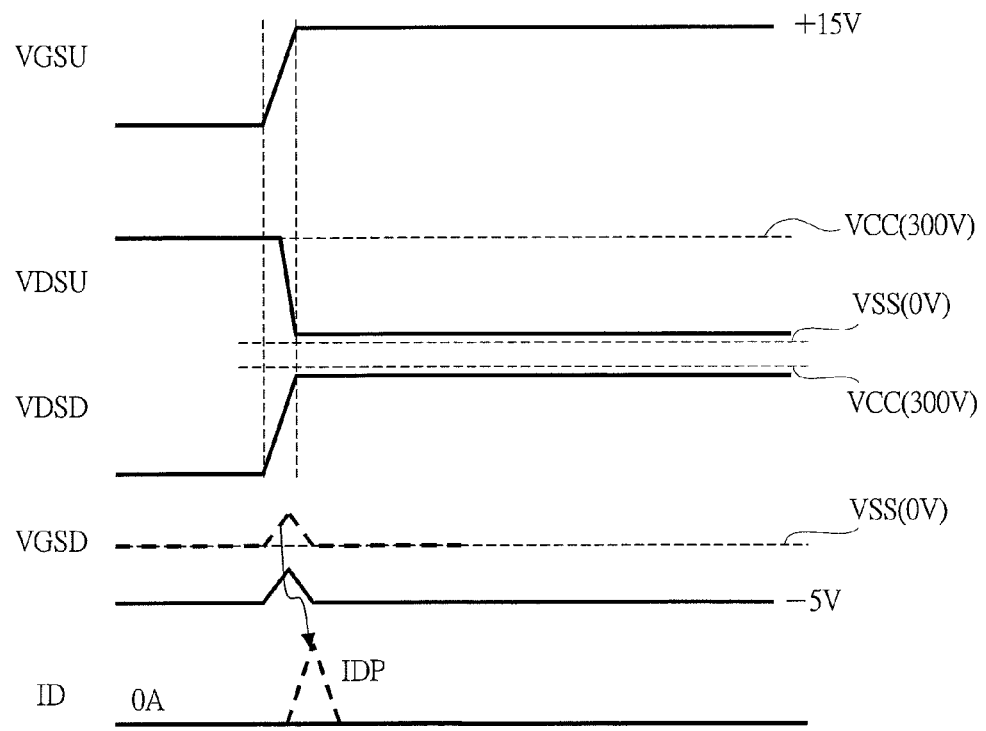

SEMICONDUCTOR DRIVER CIRCUIT AND POWER CONVERSION DEVICE

CROSS-REFERENCE TO RELATED APPLICATION

The present application claims priority from Japanese Patent Application No. 2012-086686 filed on Apr. 5, 2012, the content of which is hereby incorporated by reference into this application.

TECHNICAL FIELD OF THE INVENTION

The present invention relates to a semiconductor driver circuit and a power conversion device, and relates to a technique effectively applied to, for example, a power conversion device provided with a power semiconductor device using silicon, silicon carbide material, or others and a semiconductor driver circuit for driving the power semiconductor device.

BACKGROUND OF THE INVENTION

For example, Japanese Patent Application Laid-Open Publication No. 2000-333441 (Patent Document 1) describes a configuration in which, in order to shorten a mirror time of an insulating-gate type semiconductor element and shorten a dead time of a PWM inverter provided with the semiconductor element, a series circuit including a capacitor and a switch is inserted between a gate of the semiconductor element and an emitter of the same. Japanese Patent Application Laid-Open Publication No. 2004-159424 (Patent Document 2) and Japanese Patent Application Laid-Open Publication No. 2009-021823 (Patent Document 3) describe methods of solving a problem of so-called false firing (which is, when a switch of a lower arm is turned OFF and a switch of an upper arm is turned ON, phenomena of rising of a gate voltage of the switch of the lower arm, resulting in erroneously turning the switch ON). More specifically, they describe methods of dynamically applying a negative voltage to the gate of the switch of the lower arm by connecting a so-called switched capacitor circuit to the gate of the switch of the lower arm and using this switched capacitor circuit. Also, "Commercially Available Cree Silicon Carbide Power Devices: Historical Success of JBS Diodes and Future Power Switch Prospects", CS MANTECH Conference, May 16th to 19th, 2011, Palm Springs, Calif., USA by Mrinal K. Das, (Non-Patent Document 1), "Atomic-scale origins of bias-temperature instabilities in SiC—SiO2 structures", APPLIED PHYSICS LETTERS 98, 063507, 2011 by Xiao Shen and other seven (Non-Patent Document 2), and "Time Dependence of Bias-Stress-Induced SiC MOSFET Threshold-Voltage Instability Measurements", IEEE Transactions on Electron Devices, Vol. 55, No. 8, pp 1835 to 1840, August 2008 by Aivars J. Lelis and other six (Non-Patent Document 3) describe a fact that a threshold voltage is varied when a SiC MOSFET is continuously conducted.

SUMMARY OF THE INVENTION

In such large social trends as global environment conservation, the significance of electronics business whose environmental burden is reduced has been increased. Above all, a power device is used for inverters of a railroad vehicle and hybrid/electric vehicles, an inverter of an air conditioner, a power supply of consumer equipment such as a personal computer, and others, and improvement in a performance of the power device largely contributes to improvement in power efficiencies of an infrastructural system and consumer equipment. The improvement in the power efficiencies means reduction of energy resources required for operating systems, in other words, means emission reduction of carbon dioxide, that is, the reduction of the environmental burden. Accordingly, research and development for improving the performance of the power device have been actively performed.

Generally, a material of the power device is silicon (Si) as similar to that of a large scale integrated circuit (LSI). In a power conversion device (such as an inverter) using this Si power device, development for achieving such characteristics as low ON resistance (Ron), high current density, and high breakdown voltage has been actively performed by optimizing device structures of a diode and a switch element and a profile of an impurity concentration in order to reduce energy loss caused in the inverter or others. Also, in recent years, a chemical compound semiconductor such as silicon carbide (SiC) and gallium nitride (GaN) whose band gap is larger than that of silicon has been focused as the material of the power device. Since the chemical compound semiconductor has the large band gap, it has a breakdown voltage which is 10 times a breakdown voltage of silicon or higher. Therefore, a chemical compound device has a thinner film thickness than that of a Si device so as to drastically decrease the resistance value (Ron) upon the conduction. As a result, so-called conduction loss ($Ron \cdot i^2$) which is expressed by a product of the resistance value (Ron) and a conduction current (i) can be reduced so as to largely contribute to the improvement in the power efficiencies. In the focus on such a feature, development for a diode and a switch element using the chemical compound material has been actively performed.

Such a power device is generally applied to so-called inverter device (DC/AC conversion device) as, for example, illustrated in FIG. 6 of Patent Document 1. The inverter device is obtained by connecting two of the switch element formed of the power device and a free wheel diode in series between a power supply on a high voltage side (upper arm) and a power supply on a low voltage side (lower arm). By alternately turning ON and OFF the switch elements of the upper and lower arms, a DC level at a previous stage to the inverter device is converted into an AC level, and is supplied to a load circuit such as an AC isolation transformer and a motor at a subsequent stage. The loss caused in the inverter at this time is mainly exemplified as the conduction loss due to the ON resistances (Ron) of the switch element and the diode as described above, the recovery loss, or the switch loss caused by current flowing between a drain and a source during a switching operation, that is, during a period when the switch element shifts from the ON to the OFF states or from the OFF to the ON states (period during existence of a potential difference between the drain and the source).

A SiC MOSFET (hereinafter referred to as SiCMOS) is exemplified as an element which is expected to be applied to such a switch element. The SiCMOS has the same element structure as that of an existing Si MOSFET, and a method of driving the SiCMOS is also the same as a method of driving the Si MOSFET. In other words, it is convenient that an existing gate driver circuit for the Si element is appropriable. Further, the ON resistance of the same is lower than that of the Si element, and therefore, the SiCMOS has an advantage that the loss due to the inverter operation can be reduced. However, regarding the SiCMOS, a problem that a threshold voltage is varied by the continuous conducting operation has been reported as described in Non-Patent Documents 1 to 3. FIG. 14 illustrates an outline of "drain current—gate current characteristics" obtained when the threshold voltage is varied. By this drawing, it is illustrated that the threshold is shifted by "δVtp" toward a positive side when a positive bias is applied to a gate for long time (Positive Bias Temperature Instability) and the threshold is shifted by "δVtn" toward a negative side when a negative bias is applied to the gate for long time (Negative Bias Temperature Instability). By the shift of the threshold as described above, the following new problems are caused.

That is, since the threshold shifts toward the negative side, short-circuit current loss due to so-called false firing is caused in the inverter device in some cases. This false firing is caused in a case, for example, as illustrated in FIG. 15 that the upper arm is turned from the OFF state to the ON state (for example, VGSU: −5 V to +15 V) in a condition in which the lower arm is the OFF state (for example, VGSD=−5 V). In this case, due to rapid increase in a drain voltage VDSD of the lower arm, a discharge/charge current is flown through a capacity between the gate and the drain of the switch element of the lower arm, and, as a result, the gate/source voltage VGSD of the switch element of the lower arm increases from a voltage level of the OFF state. And, if this voltage level exceeds a threshold of the switch element, the switch element of the lower arm whose state should be normally the OFF state is erroneously turned ON. Such phenomena that a switch to be normally OFF is erroneously turned ON are referred to as false firing. The false firing can be also caused in a case of using the Si MOSFET as the switch element of the lower arm. However, particularly in the case of using the Si CMOS, the false firing is easier to occur because the threshold shifts toward the negative side due to the continuous application of the negative voltage to the gate in the OFF period. Further, the longer the time of the application of the negative voltage is, the larger a degree of this threshold shift is, and therefore, the longer the time of the application of the negative voltage is, the further the false firing is easier to occur.

When this false firing occurs, the switch element of the lower arm is turned ON, and therefore, a short circuit is caused between a high-voltage side power supply on the upper-arm side and a low-voltage side power supply on the lower-arm side, and a large short-circuit current "IDP" is flown between the power supplies. This short-circuit current has a possibility resulting in increase in the losses of the inverter device so as to heat the switch element to be damaged in some cases. Also, in the degree of the shift of the threshold, it has a possibility that the shifting is not uniformly caused among a plurality of chips. This case has a risk that a return current concentrates on an element having a large degree of the shift of the threshold (an element whose threshold has decreased) so as to heat the element to be damaged. As described above, it has been found by the inventor that the SiCMOS has not only the advantages of the low ON resistance and of the appropriable peripheral circuit of the Si element but also the problem of the damage of the element caused by the loss increase and the current concentration due to the occurrence of the false firing by the variation in the threshold.

As means for solving such a problem, so-called switched capacitor method as disclosed in Patent Documents 2 and 3 is cited. However, in the method of Patent Documents 2 and 3, the negative voltage is continuously applied to the gate during a period when the switch element is in the OFF state. Therefore, in the case of using the SiCMOS as the switch element as described above, the degree of the shift of the threshold is adversely increased in the tendency to be turned ON easier. As a result, as illustrated in, for example, FIG. 15, there are risks that the false firing occurs in the lower arm at a moment when the upper arm is turned ON during the OFF period of the lower arm, and that the false firing occurs in the lower arm by micro noises or others even after the upper arm is turned ON. Also, in the switched capacitor method as described in Patent Documents 2 and 3, the negative voltage of the gate of the switch element is maintained by a floating node between the gate node and one end of the capacitor, and therefore, it is difficult to maintain a stable negative voltage for a predetermined period of time in some cases due to the noises, a leakage current, or others. For example, a diode is connected to the floating node in Patent Document 2, and there is a risk that the leakage current occurs via the diode.

Further, in the switched capacitor method, while it is required to generate a desired negative voltage level by optimally designing a capacity value thereof or others in consideration of a gate capacity of the switch element or others, there is a risk that the optimization of the capacity value is difficult at this time. That is, in the case of using the SiCMOS as the switch element, it is required to consider the degree of the shift of the threshold, the inter-chip variation in the degree of the shift, and others as described above, and therefore, it cannot be said that the optimization of the capacity value is easy. Still further, in a case of changing the switch element itself into a different one, it is required to design a constant of the switched capacitor again in accordance with the change, and therefore, there is a possibility to result in increase in development period.

The present invention has been made in consideration of such circumstances. In a power conversion device provided with a power semiconductor device and a semiconductor driver circuit for driving the power semiconductor device, one of preferred aims of the present invention is to prevent the false firing so as to achieve the improvement in the reliability. The above and other preferred aims and novel characteristics of the present invention will be apparent from the description of the present specification and the accompanying drawings.

The typical embodiment of the inventions disclosed in the present application will be briefly summarized as follows.

A power conversion device according to the present embodiment is provided with: a first transistor switch inserted between a first power supply voltage and an output node; a second transistor switch inserted between a second power supply voltage higher than the first power supply voltage and an output node; and a first driver circuit for controlling turning ON/OFF of the first transistor switch. When the first transistor switch is controlled to be turned OFF, the first driver circuit applies a first voltage between a gate and a source thereof. However, when the second transistor switch is shifted from the OFF state to the ON state at a first timing in the state that the first voltage is applied, the first driver circuit temporarily applies a second voltage lower than the first voltage between the gate and the source of the first transistor switch during a first period which crosses over the first timing.

The effects obtained by typical aspects of the present invention disclosed in the present application will be briefly described below. In a power conversion device provided with a power semiconductor device and a semiconductor driver circuit for driving the power semiconductor device, the false firing can be prevented, and the improvement in the reliability can be achieved.

BRIEF DESCRIPTIONS OF THE DRAWINGS

FIG. 15 is an explanatory diagram illustrating one example of a state that false firing occurs.

DESCRIPTIONS OF THE PREFERRED EMBODIMENTS

Figure 1:
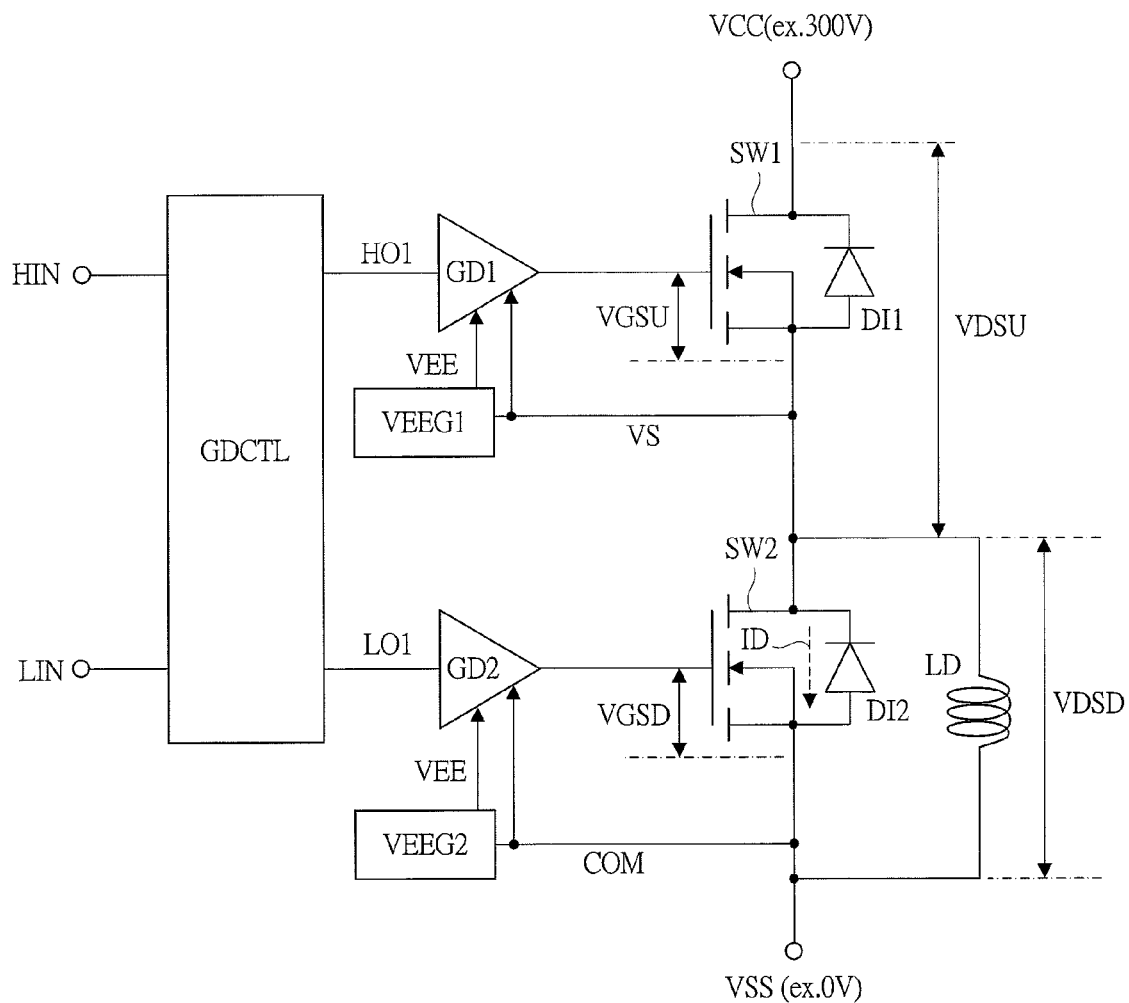
FIG. 1 is a schematic diagram illustrating a configuration example of a principal part of a power conversion device according to a first embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Note that, in the embodiments, a MOSFET (Metal Oxide Semiconductor Field Effect Transistor) (which is abbreviated as "MOS transistor") is used as one example of a MISFET (Metal Insulator Semiconductor Field Effect Transistor). However, as a gate insulating film, a non-oxide film is not excluded. In the drawings, a p-channel type MOS transistor (PMOS transistor) is distinguished by providing a circle symbol thereto from an n-channel type MOS transistor (NMOS transistor).

Hereinafter, embodiments of the present invention will be described in detail based on the drawings. Note that the same components are denoted by the same reference symbols throughout the drawings for describing the embodiments, and the repetitive description thereof will be omitted.

(First Embodiment)

<<Configuration Example and Operation Example of Power Conversion Device (Principal Part)>>

FIG. 1 is a schematic diagram illustrating a configuration example of a principal part of a power conversion device according to a first embodiment of the present invention. Here, the power conversion device as illustrated in FIG. 1 is a half bridge circuit. The half bridge circuit is appropriately used for such various purposes as a part of a power supply device of a DC/DC conversion circuit or others, as a part of a power supply device of a DC/AC conversion circuit or others by expansion into a full bridge circuit, a three phase inverter circuit, or others, and as a part of a motor control device. The half bridge circuit of FIG. 1 is provided with: a gate driver control circuit GDCTL; an upper-arm side switch element SW1 and a lower-arm side switch element SW2; free wheel diodes DI1 and DI2 corresponding to the respective switch elements SW1 and SW2; gate driver circuits GD1 and GD2 corresponding thereto; and negative-potential generating circuits VEEG1 and VEEG2 corresponding thereto.

The switch elements SW1 and SW2 are configured of, for example, an n-channel type SiC MOSFET (SiCMOS). In the SW1, a power supply voltage VCC (for example, 300 V or others) is supplied to a drain, and a source is connected to a drain of the SW2. To a source of the SW2, a ground power supply voltage VSS (for example, 0 V or others) is supplied. In each of the free wheel diodes DI1 and DI2, a source side is inserted between the source and the drain of the respective SW1 and SW2 as an anode, and a drain side is inserted therebetween as a cathode. The gate driver control circuit GDCTL receives an upper-arm control signal HIN and a lower-arm control signal LIN, and outputs an upper-arm driver control signal HO1 and a lower-arm driver control signal LO1. The HIN and LIN are generated by using, for example, a microcomputer or others. The GDCTL plays roles of, for example, a voltage level converting function, a timing adjusting function, a noise cancelling function, and a various-type protecting function for the HIN and LIN.

The negative-potential generating circuits VEEG1 and VEEG2 are, for example, a regulator circuit or others. The VEEG1 generates a negative potential VEE which is a lower potential than a source potential VS of the switch element SW1 to be a reference, and the VEEG2 generates a negative potential VEE which is a lower potential than a source potential COM (VSSS) of the switch element SW2 to be a reference. The upper-arm driver control signal HO1 is inputted to the gate driver circuit GD1 so as to drive the gate of the SW1, and the lower-arm driver control signal LO1 is inputted to the gate driver circuit GD2 so as to drive the gate of the SW2. At this time, the GD1 generates a potential level on the low side by using the VEE or the VS, and the GD2 generates a potential level on the low side by using the VEE or the COM.

Although not particularly limited, note that, for example, the gate driver control circuit GDCTL and the gate driver circuits GD1 and GD2 are formed on a single semiconductor chip as a semiconductor driver circuit, and the negative-potential generating circuits VEEG1 and VEEG2 are formed on the same semiconductor chip as the semiconductor chip or on another semiconductor chip. Further, for example, the switch elements SW1 and SW2 are formed on still another semiconductor chip. Still further, while a load circuit (load inductor) LD is connected between the source and the drain of the SW2 in FIG. 1 as one example, a mode of the load circuit and a connection point thereof are appropriately changed depending on the intended purpose.

Figure 2:
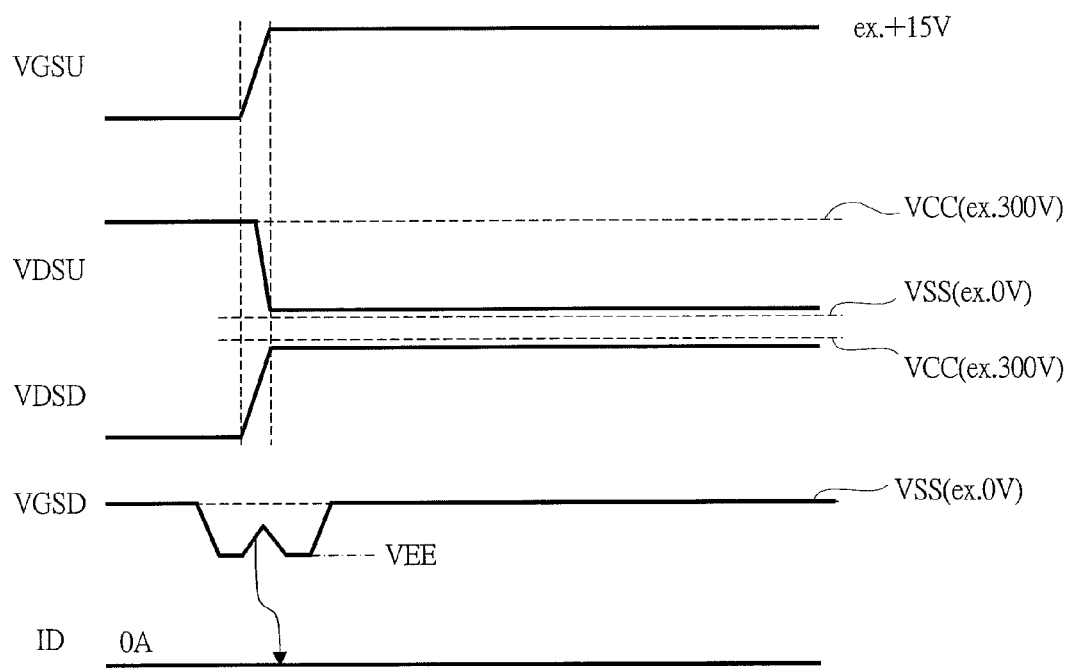
FIG. 2 is a waveform diagram illustrating an operation example of FIG. 1.

FIG. 2 is a waveform diagram illustrating an operation example of FIG. 1. An example of FIG. 2 shows waveforms obtained when the upper-arm side switch element SW1 is shifted from the OFF state to the ON state in the state that the lower-arm side switch element SW2 is turned OFF. In FIG. 2, the VGSU is a voltage between the gate and the source of the SW1, the VDSU is a voltage between the drain and the source of the SW the VDSD is a voltage between the drain and the source of the SW2, and the VDSD is a voltage between the drain and the source of the SW2, and the VGSD is a voltage between the gate and the source of the SW2. A driving method according to the present first embodiment has a feature that the VGSD of the SW2 is shifted from the level of the ground power supply voltage VSS (0-V level) to the level of the negative potential VEE immediately before turning the SW1 ON, and then, the VGSD is returned from the VEE level to the VSS level after the switching operation of the SW1 is completed. And, during the OFF period of the SW2, the VGSD is set at the VSS level in a period except for this switching period of the SW1.

In more detailed explanation, when the gate-source voltage VGSU of the upper-arm side switch element SW1 is shifted first from 0 V to, for example, +15 V, the drain-source voltage VDSU decreases down to about the ON voltage (about 1 V) of the SW1. Therefore, the drain-source voltage VDSD of the lower-arm side switch element SW2 increases from 0 V to about 299 V. At this time, a charge/discharge current flows through a gate-drain parasitic capacitance Cgd of the SW2, and this current flows into the gate of the SW2. As a result, the gate-source voltage VGSD of the SW2 transitionally increases. Here, in the case of using the driving method of the above-described Patent Documents 2 and 3, a negative potential is dynamically and continuously applied to between the gate and the source during the OFF period of the SW2. At this time, the negative potential is unstable, and besides, the threshold voltage of the SW2 shifts in the tendency to be easily turned ON on time series, and therefore, the false firing is easy to occur in the SW2 at the moment when the SW1 is turned ON or even after that, and, as a result, there is a risk that a flow-through current from the upper arm toward the lower arm occurs.

On the other hand, in the driving method of the present first embodiment, a static and stable (large driving performance) negative potential VEE generated in the negative-potential generating circuit VEEG is used. Accordingly, even if the driving currents of the switch elements SW1 and SW2 are large (such as 100 mA to about several A) so that a large current to some extent is coupled at the gate of the SW2 at the moment when the SW1 is turned ON, the increase in the gate potential can be sufficiently suppressed. Also, for shifting the gate-source voltage VGSD of the SW2 from the VEE level to the ground power supply voltage VSS level after the switching operation of the SW1 is completed, the time during when the VEE level is applied to the SW2 can be shortened, and therefore, the degree of the shift of the threshold voltage as described above can be minimally suppressed. As a result, the false firing is difficult to occur in the SW2, and therefore, the occurrence of the flow-through current from the upper arm toward the lower arm can be prevented. In this manner, the power conversion device with the low loss obtained by taking the advantage of the feature of the low ON resistance of the SiCMOS can be achieved, and besides, the improvement of the reliability thereof can be improved.

Here, note that the gate-source voltage VGSD of the switch element SW2 shifts between the level of the ground power supply voltage VSS and the level of the negative potential VEE. However, depending on cases, the voltage can be also configured so as to shift between, for example, a first negative potential level lower than the VSS level and a second negative potential level further lower than the first negative potential level. However, if this first negative potential level is too low, there is a problem in the degree of the shift of the threshold voltage described above, and therefore, it is desired to set the first negative potential level to a relatively shallow level. Moreover, in this case, a circuit for generating the first negative potential level and the second negative potential level is required, and therefore, it is desired to use the VSS level as illustrated in FIG. 2 in a viewpoint of a circuit area and others.

<<Details of Negative Potential Generating Circuit>>

Figure 3:
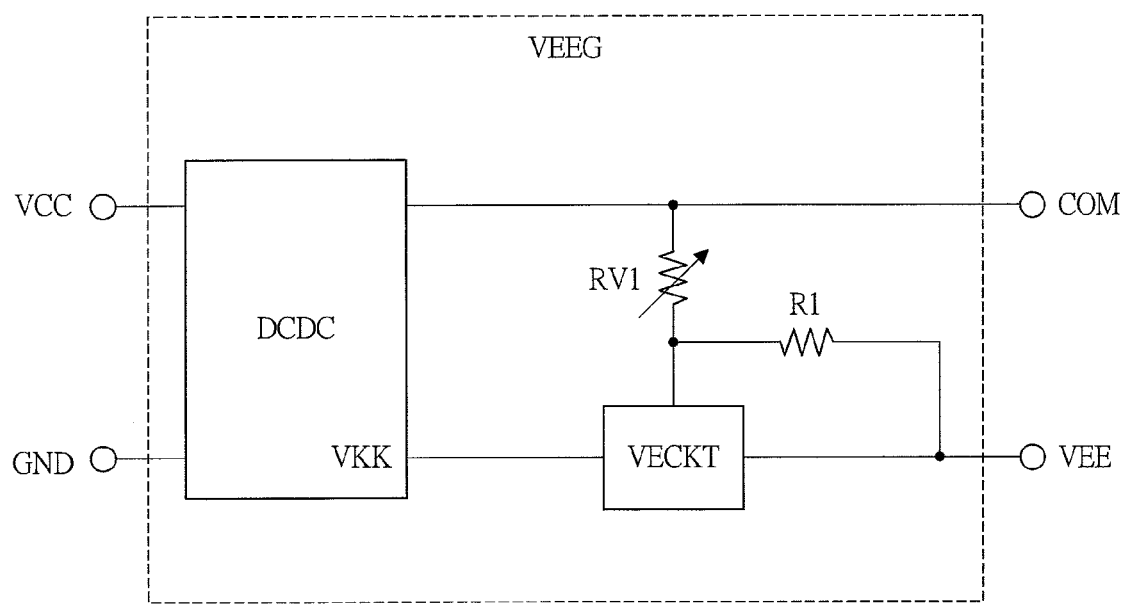
FIG. 3 is a schematic diagram illustrating a configuration example of a negative-potential generating circuit in FIG. 1.

FIG. 3 is a schematic diagram illustrating a configuration example of the negative potential generating circuit in FIG. 1. A negative potential generating circuit VEEG illustrated in FIG. 3 (here, the VEEG2 in FIG. 1) is achieved by using so-called three-terminal regulator circuit VECKT, a buck converter circuit DCDC, and others. The DCDC generates a negative potential VKK having a lower potential than the source potential COM of the switch element SW2 by using an external power supply voltage VCC. The VECKT adjusts the value of the VKK by using a ratio of a resistor R1 and a variable resistor RV1, and generates a negative potential VEE having a predetermined potential level.

For example, in a case of using a general-purpose product or others as the three-terminal regulator circuit VECKT, a resistance value of the variable resistor RV1 can be set by, for example, a rotational operation, a sliding operation, or others of so-called potentiometer. In this case, even if the combinations of the gate driver circuits GD1, GD2 or others and the switch elements SW1 and SW2 are changed, it is not required to change a design of a substrate pattern and a design of a passive component such as a conventional capacitor. In other words, there is a merit in that optimal designing of gate application bias for driving the SW1 and SW2 can be promptly performed. Note that the invention is not limited to this, and the resistance value of the variable resistor RV1 can be determined by so-called laser trimming or others. Also in this case, the designing can be achieved more prompt than that in the case of changing the conventional capacitor and others.

<<Details of Semiconductor Driver Circuit (Gate Driver Control Circuit and Gate Driver Circuit)>>

Figure 4:
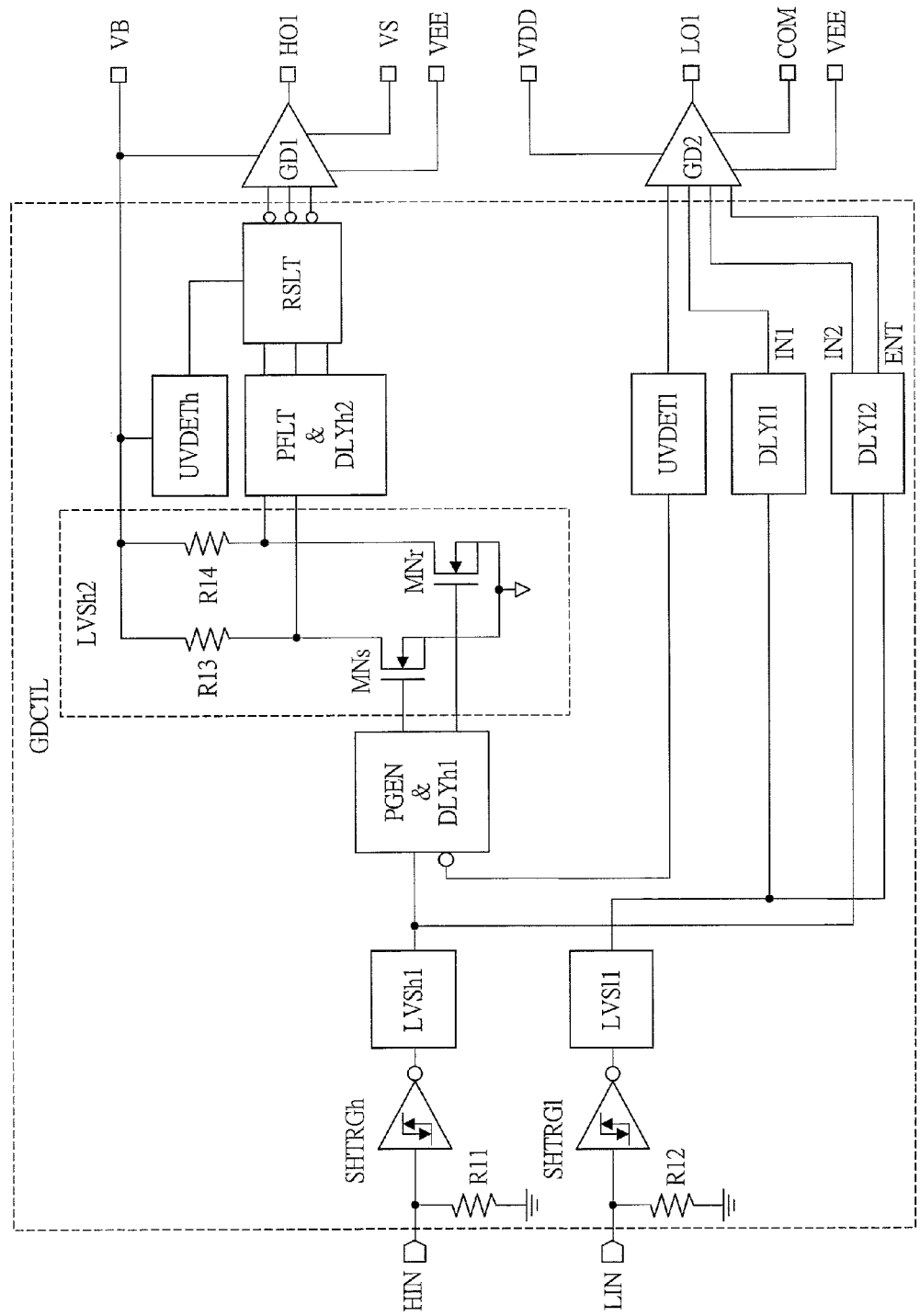
FIG. 4 is a schematic diagram illustrating a configuration example of a gate driver control circuit in FIG. 1.
Figure 5:
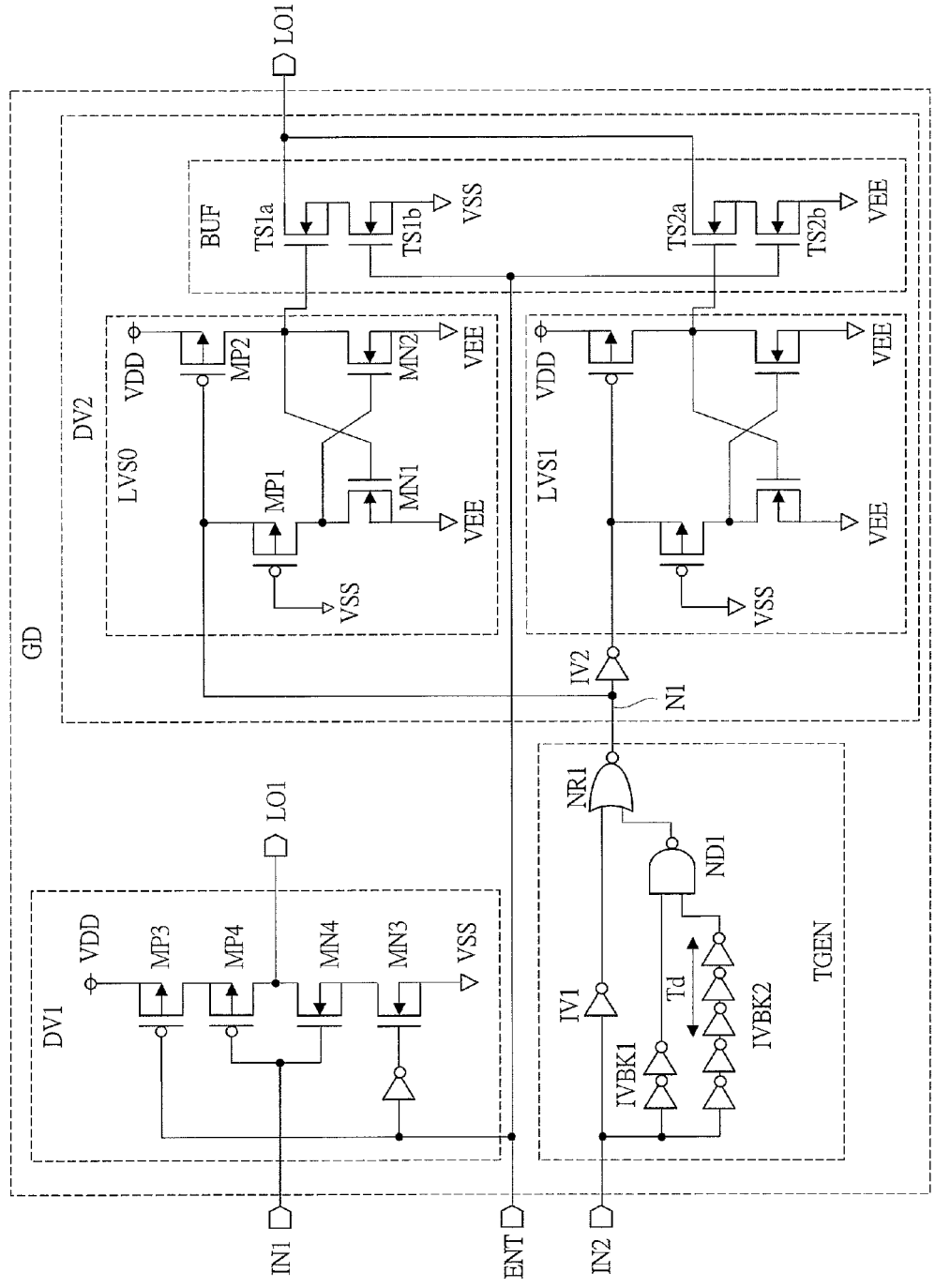
FIG. 5 is a circuit diagram illustrating a configuration example of a gate driver circuit in FIG. 1.

FIG. 4 is a schematic diagram illustrating a configuration example of the gate driver control circuit in FIG. 1, and FIG. 5 is a circuit diagram illustrating a configuration example of the gate driver circuit in FIG. 1. For the upper arm, a gate driver control circuit GDCTL in FIG. 4 is provided with: a resistor R11; a Schmitt trigger circuit SHTRGh; level shift circuits LVSh1 and LVSh2; a one-shot pulse generating circuit PGEN and a delay circuit DLYh1; a voltage detecting protection circuit UVDETh; a pulse filter PFLT and a delay circuit DLYh2; and a RS latched circuit RSLT. Also, for the lower arm, the gate driver control circuit is provided with: a resistor R12; a Schmitt trigger circuit SHTRG1; a level shift circuit LVSl1; a voltage detecting protection circuit UVDET1; and delay circuits DLYl1 and DLYl2.

In FIG. 4, when the upper-arm control signal HIN (or the lower-arm control signal LIN) is asserted, the voltage level is converted by the level shift circuit LVSh1 (or LVSl1) via the Schmitt trigger circuit SHTRGh (or SHTRG1). The SHTRGh (or SHTRG1) and the resistor R11 (or R12) are circuits for transferring a stable output level to the LVSh1 (or LVSl1) even if the HIN (or LIN) is fluctuated. The LVSh1 (or LVSl1) converts a high output level of the HIN (or LIN) to the level of the power supply voltage VDD (for example, 15 V or others).

The one-shot pulse generating circuit PGEN generates a one-shot pulse signal at each of rising and dropping of the output (the upper-arm control signal HIN) of the level shift circuit LVSh1. The level shift circuit LVSh2 is configured of an NMOS transistor pair (MNs and MNr) and a resistor pair (R13 and R14). The MNs converts a high output level of the one-shot pulse signal (for the rising) outputted from the PGEN into a level of a high potential VB, and the MNr converts a high output level of the one-shot pulse signal (for the dropping) outputted from the PGEN into the VB level. The VB is set to be a voltage (VS+15 V) which is obtained by adding, for example, 15 V to the source voltage (VS) of the switch SW1 in FIG. 1 as a reference, and is a high-potential side power supply voltage of the gate driver circuit GD1.

The output signal of the level shift circuit LVSh2 is inputted to the RS latched circuit RSLT via the pulse filter PFLT and the delay circuit DLYh2. For example, the one-shot pulse signal (for the rising) outputted from the LVSh2 is a set input of the RSLT, and the one-shot pulse signal (for the dropping) outputted from the LVSh2 is a reset input of the RSLT. At this time, the PFLT removes an unstable signal except for a defined control signal. The gate driver circuit GD1 takes an output signal (VB/VS level) of this RSLT as an input, and outputs an upper-arm driver control signal HO1. The voltage detecting protection circuit UVDETh monitors the high potential VB, and performs the reset input to the RSLT when the high potential drops, so that the switch element SW1 is protected via the GD1.

Also, the delay circuit DLYl1 delays an output signal of the level shift circuit LVSl1 on the lower-arm side, and outputs a control signal IN1. The delay circuit DLYl2 receives an output signal of the level shift circuit LVSh1 on the upper-arm side in addition to the output signal of the LVSl1, and add a predetermined delay thereto, and then, outputs a control signal IN2 and an enable signal ENT. The gate driver circuit GD2 takes these IN1, IN2, and ENT as an input to be operated, and outputs a lower-arm driver control signal LO1. The IN1 is a signal for controlling turning ON/OFF of the switch element SW2 in accordance with the lower-arm control signal LIN, and the IN2 and the ENT are signals for controlling the temporal shift of the gate-source voltage VGSD of the SW2 as illustrated in FIG. 2. The voltage detecting protection circuit UVDET1 monitors the power supply voltage VDD, and protects the switch element SW2 via the GD2 when the power supply voltage drops lower than a predetermined level. Further, it notifies the one-shot pulse generating circuit PGEN to protect the switch element SW1 via the gate driver circuit GD1. The VDD is a power supply voltage for the entire gate driver control circuit GDCTL, and besides, a high-potential side power supply voltage of the GD2.

Each of the delay circuits DLYh1 and DLYh2 on the upper-arm side and each of the delay circuits DLYl1 and DLYl2 on the lower-arm side are configured of, for example, a multi-stage CMOS inverter circuit or others although not particularly limited. Here, as seen from FIG. 2, for example, when the upper-arm control signal HIN is asserted, it is required to shift the lower-arm driver control signal LO1 (VGSD) to the level of the low potential VEE prior to the shift of the upper-arm driver control signal HO1 (VGSU) to the ON level. Accordingly, in the DLYh1, DLYh2, and DLYl2, the timing is adjusted so as to establish such a relation. Also, in the DLYl1, the timing is adjusted so as to, for example, be balanced with a delay path on the upper-arm side in consideration of the ON/OFF operations of the switch elements SW1 and SW2 at normal times.

Note that a specific circuit configuration of each circuit block can be achieved by using a general logic circuit, and therefore, explanation thereof is omitted here. Also the gate driver control circuit GDCTL is not always limited to such a configuration but can be appropriately changed depending on an intended purpose as long as a mechanism for achieving the timing as illustrated in FIG. 2 such as the delay circuit DLYl2 in FIG. 4 is provided. In other words, the delay circuit DLYl2 or others is merely added to an existing gate driver control circuit, and therefore, the configuration can be achieved by additional circuits as little as possible, and an additional cost can be suppressed lower.

On the other hand, the gate driver circuit GD illustrated in FIG. 5 (which is the GD2 in FIG. 1 here) is provided with driver circuits DV1 and DV2 and a timing generating circuit (one-shot pulse generating circuit) TGEN. The DV1 is used in the control of the lower-arm driver control signal LO1 at normal times in accordance with the control signal IN1 in FIG. 4 (lower-arm control signal LIN), the DV2 is used in the temporal control of the LO1 to be the negative potential VEE in accordance with the shift of the upper-arm driver control signal HO1 (VGSU) to be the ON level. The TGEN controls the time for applying the negative potential VEE as illustrated in FIG. 2.

The driver circuit DV1 is configured of so-called clocked inverter circuit in which two PMOS transistors MP3 and MP4 and two NMOS transistors MN3 and MN4 are connected in series between the power supply voltage VDD and the ground power supply voltage VSS. The DV1 is activated when the enable signal ENT is at a "L" level, takes the control signal IN1 as an input, and outputs the lower-arm driver control signal LO1. On the other hand, when the ENT is at a "H" level, an output node of the LO1 is controlled to be a high impedance state (HiZ). The timing generating circuit TGEN is provided with: an inverter circuit IV1; inverter circuit blocks IVBK1 and IVBK2 each formed of a multi-stage inverter circuit; a NAND arithmetic circuit ND1; and a NOR arithmetic circuit NR1. The TGEN takes the control signal IN2 as an input, generates a one-shot "H" pulse signal having a predetermined pulse width Td for an output node (node N1) of the NR1. The pulse width Td at this time is determined by difference in the delay time between the IVBK1 and the IVBK2, and the delay time from the shift of IN2 until the generation of the one-shot "H" pulse signal is mainly determined by the delay time of the IVBK1.

The driver circuit DV2 is provided with: an inverter circuit IV2; two level shift circuits LVS0 and LVS1; and a buffer circuit BUF. Each of the LVS0 and LVS1 is provided with: two cross-coupled NMOS transistors MN1 and MN2; and two PMOS transistors MP1 and MP2 whose drains are connected to the drains of the MN1 and MN2, respectively. The negative potential VEE is supplied to sources of the MN1 and MN2, a source of the MP1 is connected to a gate of the MP2, and the ground power supply voltage VSS is applied to a gate of the MP1. A signal of the node N1 is inputted to a source of the MP1 of the LVS0 (a gate of MP2), and an inversed signal of the N1 is inputted to a source of the MP1 of the LVS1 (a gate of the MP2) via the inverter circuit IV2. In this manner, the LVS0 converts a signal level (VDD/VSS level) of the N1 into the VDD/VEE level and outputs it, and the LVS1 outputs an inversed signal having the same voltage level as the signal level.

The buffer circuit BUF is provided with: two switches TS1a and TS1b connected in series between the output node of the lower-arm driver control signal LO1 and the ground power supply voltage VSS; and two switches TS2a and TS2b connected in series between the output node of the LO1 and the negative voltage VEE. Here, each switch is an NMOS transistor. The TS1b and TS2b are turned ON when the enable signal ENT is at the "H" level as contrary to the case of the driver circuit DV1. The turning ON/OFF of the TS1a is controlled by an output signal of the level shift circuit LVS0, and the turning ON/OFF of the TS2a is controlled by an output signal of the level shift circuit LVS1. In this manner, in a case of the ENT at the "H" level, the VEE level is outputted as the LO1 during a period when the node N1 is at the "H" level, and the VSS level is outputted as the LO1 during a period when the N1 is at the "L" level. On the other hand, in a case of the ENT at the "L" level (and a case of the N1 at the "L" level), the output node of the LO1 is at the HiZ.

Figure 6:
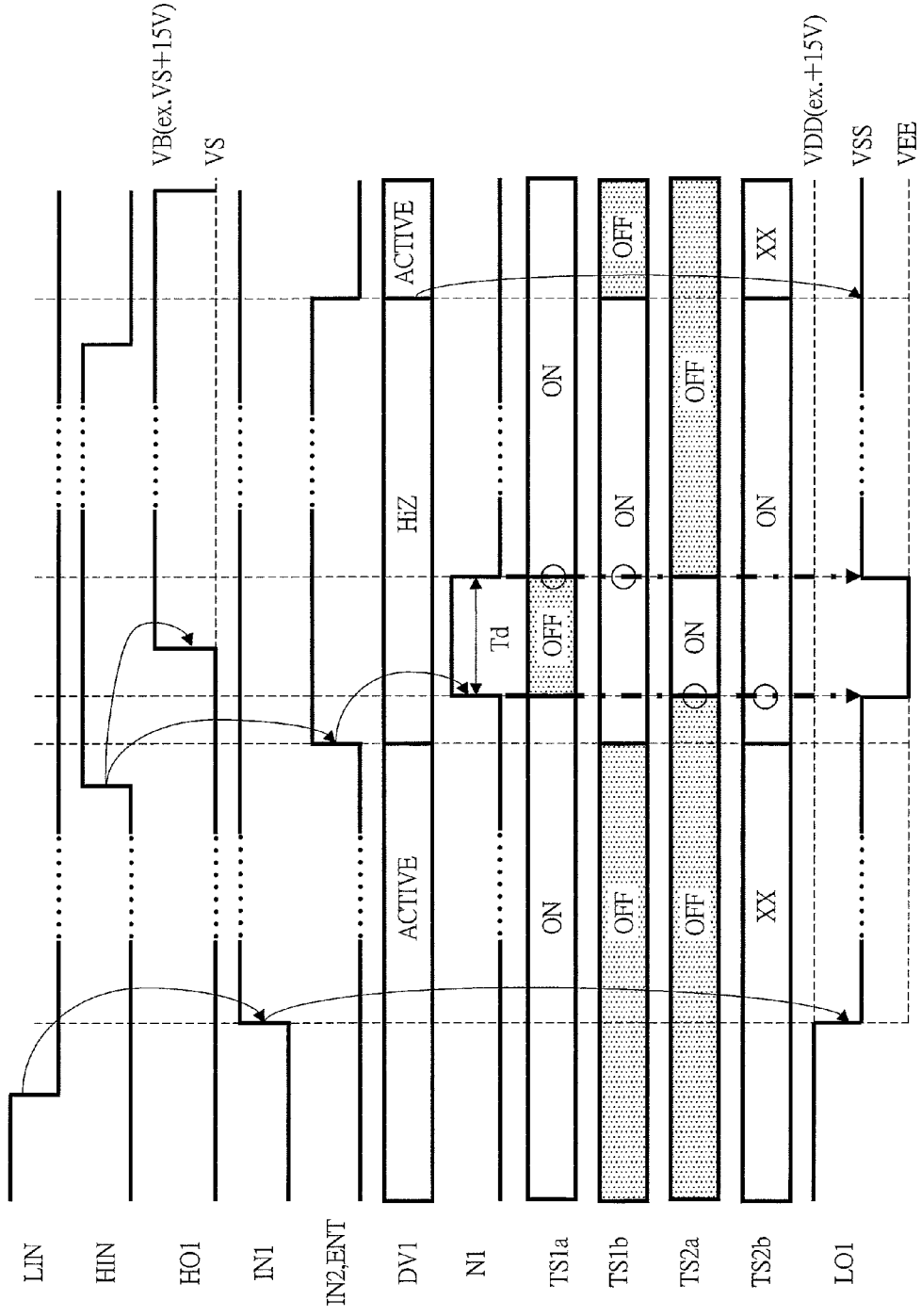
FIG. 6 is an explanatory diagram illustrating operation examples of FIGS. 4 and 5.

FIG. 6 is an explanatory diagram illustrating operation examples of FIGS. 4 and 5. First, during a period when the lower-arm control signal LIN is asserted to the "H" level, the control signal IN1 is asserted to the "L" level in accordance with the assertion. At this time, since the enable signal ENT is at the "L" level (desirably, at the negative potential VEE), the output of the driver circuit DV2 is at the HiZ, and the driver circuit DV1 outputs the level of the power supply voltage VDD as the lower-arm driver control signal LO1 via the PMOS transistors (pull-up switches) MP3 and MP4. In accordance with the output, the lower-arm side switch element SW2 is turned ON. Then, when the LIN is negated to the "L" level, the IN1 is negated to the "H" level in accordance with the negation, and the DV1 outputs the level of the ground power supply voltage VSS as the LO1 via the NMOS transistors (pull-down switches) MN3 and MN4, so that the SW2 is turned OFF.

On the other hand, under this state, when the upper-arm control signal HIN is asserted to the "H" level so as to shift the upper-arm side switch element SW1 to the ON state, the control signal IN2 and the enable signal ENT are shifted to the "H" level in accordance with the assertion of the HIN. In accordance with the shift, the output of the driver circuit DV1 is the HiZ. When the IN2 is shifted to the "H" level, a one-shot pulse having the "H" level is generated at the node N1 via the timing generating circuit TGEN. In a period (Td) when the one-shot pulse is at the "H" level, the negative potential VEE is applied as the lower-arm driver control signal LO1 via the switches (pull-down switches) TS2a and TS2b of the buffer circuit BUF. Here, in the period (Td) when the one-shot pulse is at the "H" level, the upper-arm driver control signal HO1 is asserted to the level of the high potential VB by the adjustment of each delay circuit as described above for the gate driver control circuit GDCTL in FIG. 4. Also, in a period at the "L" level prior to and subsequent to the period (Td) when the one-shot pulse is at the "H" level, the ground power supply voltage VSS is applied as the LO1 via the switches (pull-down switches) TS1a and TS1b of the BUF. Note that the Td is set to several hundreds of ns or shorter although not particularly limited.

Then, when the upper-arm control signal HIN is negated to the "L" level, the control signal IN2 and the enable signal ENT are returned to the "L" level in accordance with the negation. In this manner, the output of the driver circuit DV2 is the HiZ, and the driver circuit DV1 maintains the level of the ground power supply voltage VSS of the lower-arm driver control signal LO1 via the NMOS transistors (pull-down switches) MN3 and MN4 instead. Also, in accordance with the negation of the HIN, the upper-arm driver control signal HO1 is negated to the level of the source potential VS.

In this manner, negative-potential square waves can be temporarily applied to the switch elements by applying the gate driver control circuit and the gate driver circuit according to the present first embodiment, and therefore, the degree of the shift of the threshold voltage of the SiCMOS can be suppressed as small as possible as described in FIG. 2 and others, and the false firing can be prevented. Note that the configuration example of the gate driver circuit GD in FIG. 5 is illustrated on the premise that, while a general driver circuit (DV1) is used, circuits (TGEN and DV2) in accordance with the method of the present first embodiment are separately added, the configuration is not always limited to this configuration example but can be appropriately changed.

For example, it is also possible to employ such a method that, one CMOS inverter circuit is used instead of the DV1 and DV2, and respective pull-down switches are provided between a low-potential side power-supply node of the CMOS inverter and the lower potential VEE and between the node and the ground power supply voltage VSS, so that the ON/OFF of the switches are complementarily controlled with using a signal (having, for example, the VDD/VEE level) as that of the above-described node N1. Further, for example, it is also possible to employ such a configuration that, one PMOS transistor (pull-up switch) is provided on the pull-up side, and two NMOS transistors (pull-down switches) for the VSS and the VEE are provided in parallel on the pull-down side, so that these switches are appropriately controlled.

In the foregoing, representatively, in a power conversion device provided with a power semiconductor device and a semiconductor driver circuit for driving the power semiconductor device, the false firing can be prevented, and the improvement in the reliability can be achieved by using the present first embodiment. Note that various types of configuration examples and operation examples have been explained in FIGS. 2 to 6 with exemplifying the lower-arm side. However, as illustrated in FIG. 1, the explanation can be similarly applied to the upper-arm side. For example, in a case that the lower-arm side is shifted from the OFF state to the ON state in the ON state of the upper-arm side, the gate-source voltage on the upper-arm side instantaneously increases, and therefore, a possibility of the occurrence of the false firing arises. In this case, similarly to the case of FIG. 2, the gate-source voltage on the upper-arm side may be temporarily set to the negative potential level immediately before the lower-arm side is shifted from the OFF state to the ON state.

In a case of the application to the upper-arm side, for example, the COM in FIG. 3 may be replaced by the VS, a signal (however, having the VB/VS level) as similar to the signals of the GD2 (IN2 and ENT) may be generated and inputted to the GD1 in FIG. 4, and the VDD and the VSS in FIG. 5 may be replaced by the VB and the VS, respectively. Also, the gate driving method of the present first embodiment is not always required to be applied to both of the upper-arm side and the lower-arm side, but may be applied to only the lower-arm side, or only the upper-arm side depending on cases.

(Second Embodiment)

<<Configuration Example and Operation Example (Modified Examples) of Power Conversion Device (Principal Part) and Negative-Potential Generating Circuit>>

Figure 7:
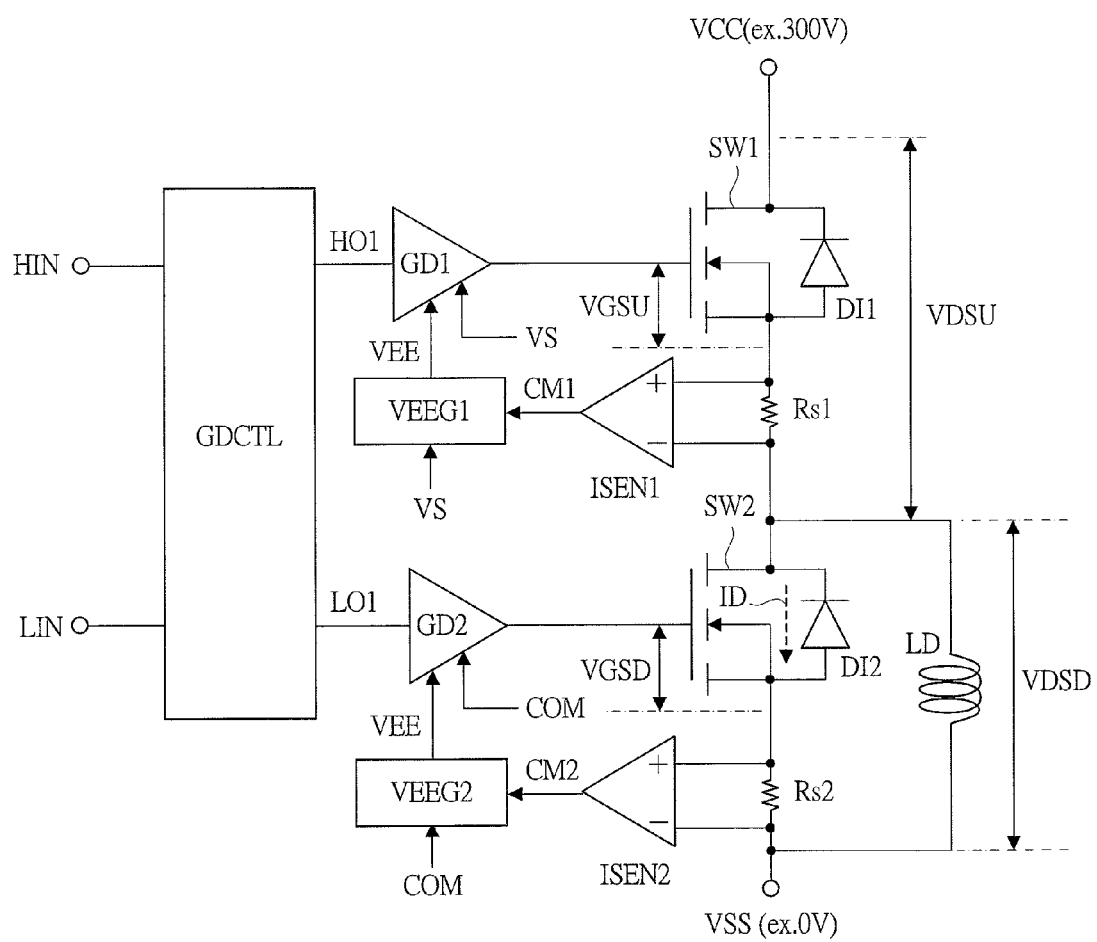
FIG. 7 is a schematic diagram illustrating a configuration example of a principal part of a power conversion device according to a second embodiment of the present invention.

FIG. 7 is a schematic diagram illustrating a configuration example of a principal part of a power conversion device according to a second embodiment of the present invention. The power conversion device as illustrated in FIG. 7 has a configuration with additional current detecting resistors Rs1 and Rs2 and current detecting circuits ISEN1 and ISEN2 in comparison to the configuration example of FIG. 1. The Rs1 is inserted between the source of the upper-arm side switch element SW1 and the drain of the lower-arm side switch element SW2, and the Rs2 is inserted between the source of the SW2 and the ground power supply voltage VSS. The ISEN1 detects a voltage between both ends of the Rs1 and outputs a detected voltage signal CM1, and the ISEN2 detects a voltage between both ends of the Rs2 and outputs a detected voltage signal CM2. The CM1 and CM2 are used in the negative potential generating circuit VEEG1 and VEEG2, respectively.

Figure 8:
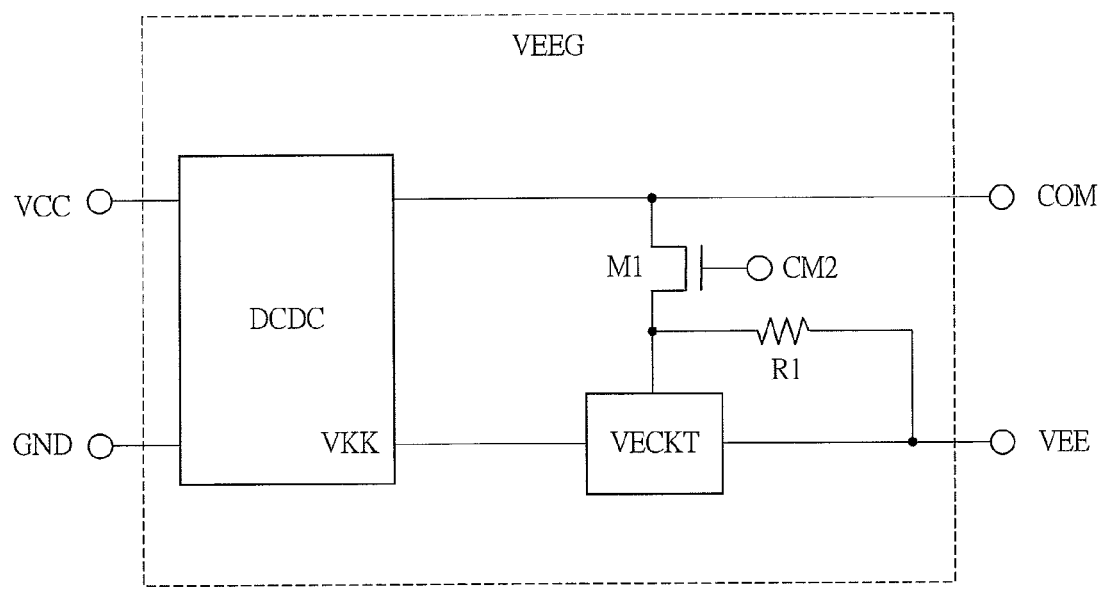
FIG. 8 is a schematic diagram illustrating a configuration example of a negative-potential generating circuit in FIG. 7.

FIG. 8 is a schematic diagram illustrating a configuration example of the negative-potential generating circuit in FIG. 7. A negative-potential generating circuit VEEG illustrated in FIG. 8 (for example, the VEEG2 in FIG. 7) has a configuration in which the variable resistor RV1 in FIG. 3 is replaced by a transistor M1 in comparison to the configuration example of FIG. 3. A detected voltage signal CM2 is applied to a gate of the M1. By using such a configuration example, even if, for example, the threshold voltage of the switch element SW2 configured of the SiCMOS is shifted or there is variation among chips in the degree of the shift, the degree of the shift or a degree of the variation can be detected by utilizing the fluctuation in the source-drain current of the SW2, and an ON resistance of the M1 can be automatically controlled by reflecting the detection. That is, for example, the ON resistance of the M1 is controlled so that the negative potential VEE is deep if the source-drain current (ID) of the SW2 is larger than a predetermined value (if the threshold voltage is lower than a predetermined value), and the ON resistance of the M1 is controlled so that the VEE is shallow if the ID is smaller than the predetermined value (if the threshold voltage is higher than the predetermined value).

In this manner, by using the present second embodiment, the negative potential VEE suitable for a state of the threshold voltage of the switch element can be automatically set in accordance with the state. As a result, switch elements of various specifications can be combined for the same semiconductor driver circuit without, for example, the adjusting operation of the negative potential or others. Also for the switch elements of the same specification, suitable correction of the variation among the chips can be performed without the adjusting operation of the negative potential or others.

(Third Embodiment)

<<Configuration Example and Operation Example of (Entire) Power Conversion Device [1]>>

Figure 9:
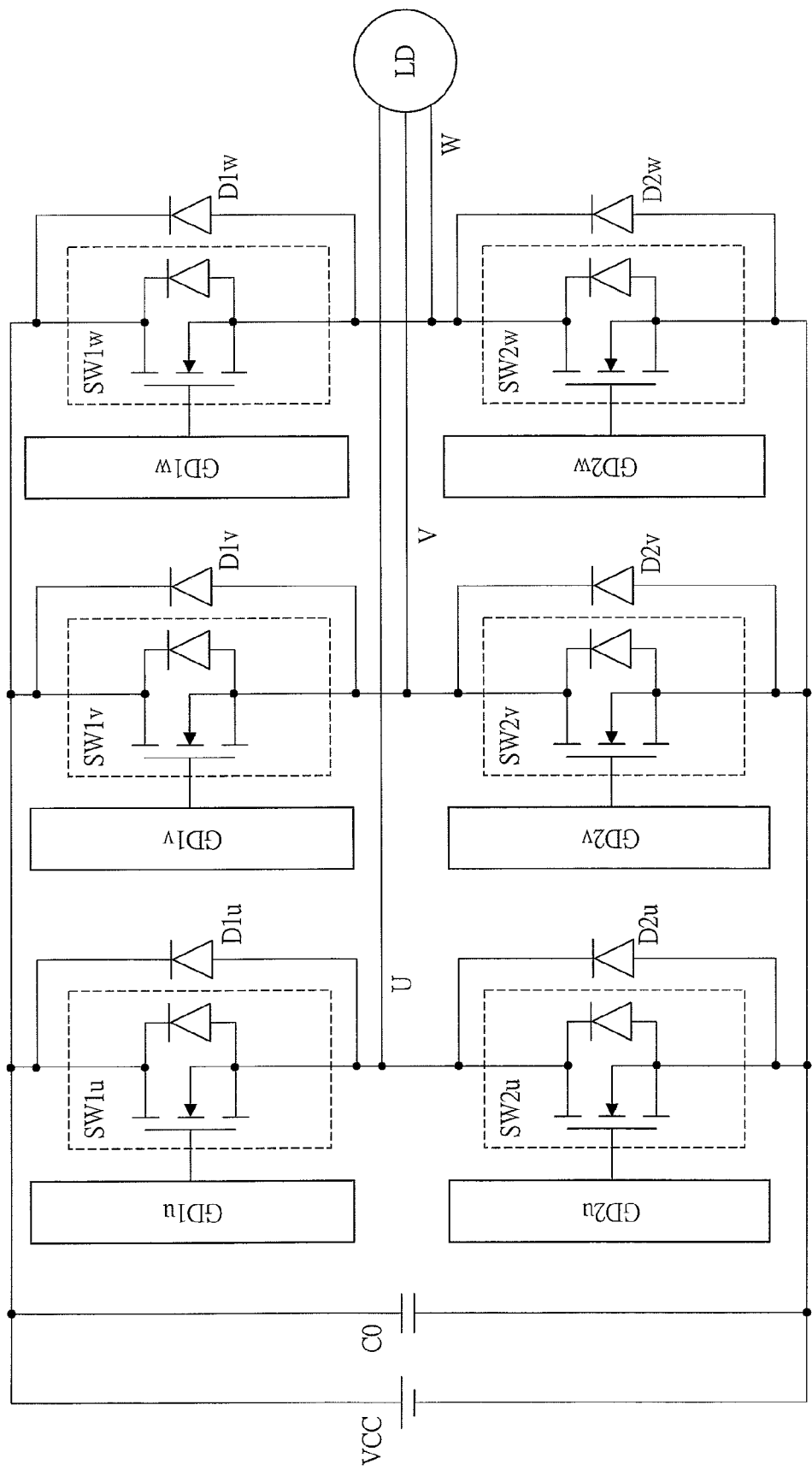
FIG. 9 is a schematic diagram illustrating one example of a configuration of a power conversion device according to a third embodiment of the present invention.

FIG. 9 is a schematic diagram illustrating one example of a configuration of a power conversion device according to a third embodiment of the present invention. The power conversion device illustrated in FIG. 9 is obtained by, for example, applying the method of the first embodiment to so-called three-phase inverter device. In FIG. 9, each of SW1$u$, SW1$v$, SW1$w$, SW2$u$, SW2$v$, and SW2$w$ is a switch element using an n-channel type SiCMOS, and respective free wheel diodes D1$u$, D1$v$, D1$w$, D2$u$, D2$v$, D2$w$ are connected to between the respective sources and drains. The SW1$u$, SW1$v$, and SW1$w$ are arranged on the upper-arm side while the SW2$u$, SW2$v$, and SW2$w$ are arranged on the lower-arm side, and the SW1$u$ and SW2$u$ are for a U phase, the SW1$v$ and SW2$v$ are for a V phase, and the SW1$w$ and SW2$w$ are for a W phase.

GD1$u$, GD1$v$, GD1$w$, GD2$u$, GD2$v$, and GD2$w$ are gate driver circuits as illustrated in FIG. 1, and drive the SW1$u$, SW1$v$, SW1$w$, SW2$u$, SW2$v$, and SW2$w$, respectively. Note that the negative-potential generating circuit as illustrated in FIG. 1 is provided to each gate driver circuit although not illustrated in the drawings. A power supply voltage VCC and a capacitor C0 are connected between one end (drain node) of an upper-arm side switch element and one end (source node) of a lower-arm side switch element. Each gate driver circuit appropriately drives turning ON/OFF of the corresponding switch element, so that alternating-current signals of three phases (the U phase, the V phase, and the W phase) whose phases are different from each other are generated from the VCC to be a direct-current signal. An LD is a load circuit for, for example, a motor or others, and is appropriately controlled by the alternating-current signals of the three phases (the U phase, the V phase, and the W phase).

Here, a detailed operation in a hard switching operation of each of the U phase, the V phase, and the W phase is similar to that of FIG. 2 or others. In the three-phase inverter device, the upper-arm side switch element (for example, the SW1$u$) is shifted to the ON state in a state that the lower-arm side switch element (for example, the SW2$u$) is in the OFF state. At this time, a lower-arm side drain potential (VD) increases up close to the level of the power supply voltage VCC. When a drain potential of the lower-arm side switch element (for example, the SW2$u$) rapidly increases, a gate potential of the lower-arm side switch element (for example, the SW2$u$) transitionally increases as explained in FIG. 2 and others. However, in the gate driver circuit according to the present embodiment, the negative potential VEE whose driving performance is high is temporarily applied to the gate of the lower-arm side switch element (for example, the SW2$u$), and therefore, the false firing in the switch element can be prevented. Also, after preventing the false firing operation, the gate potential of each switch element is shifted to the level of the ground power supply voltage VSS.

Accordingly, even if the three-phase inverter device is conducted and driven for long time, the degree of the shift of the threshold voltage of each switch element can be sufficiently suppressed, so that a high-reliability and stable power converting operation can be achieved. More particularly, such a three-phase inverter device is driven by high power often, and therefore, the false firing is easy to occur, and the damage caused when the false firing occurs could be large. According to the usage of the method of the present embodiment, the low loss can be achieved by the SiCMOS even in the operation at the high power, and the false firing can be prevented, and therefore, valuable effects can be obtained.

(Fourth Embodiment)

<<Configuration Example and Operation Example of (Entire) Power Conversion Device [2]>>

Figure 10:
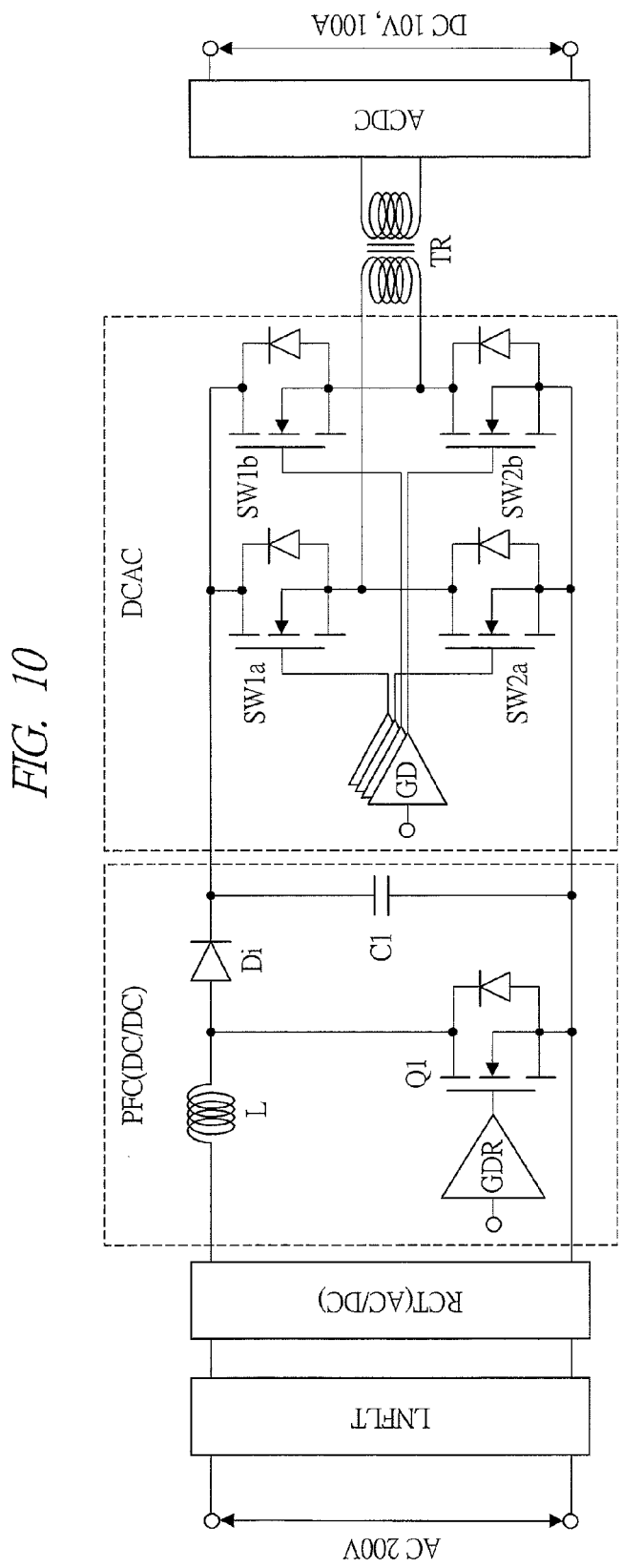
FIG. 10 is a schematic diagram illustrating one example of a configuration of a power conversion device according to a fourth embodiment of the present invention.

FIG. 10 is a schematic diagram illustrating one example of a configuration of a power conversion device according to a fourth embodiment of the present invention. The power conversion device as illustrated in FIG. 10 has a configuration obtained by, for example, applying the method of the first embodiment to an AC/DC power supply device. In the power conversion device in FIG. 10, noises of an alternating-current input (for example, AC 200 V) are cancelled by a line filter LNFLT, and an AC voltage is converted into a DC voltage (AC/DC) via a rectifying circuit (for example, a diode bridge and output capacitor) RCT. Then, a DC level is boosted up to, for example, about 400 V in a booster circuit PFC. Reference symbols in the drawings denote a coil "L", a chopper diode "Di", a main switch element "Q1", a main switch driver circuit "GDR", and a stabilized capacitor "C". Note that a method for controlling the booster circuit PFC is a general control method, and therefore, explanation thereof is omitted here.

Subsequently, the power conversion device in FIG. 10 converts the DC level of about 400 V from the booster circuit PFC into an AC level in the inverter device DCAC, and performs an AC/AC conversion (for example, AC 400 V to AC 10 V) in a transformer TR. And, an AC signal that is obtained from a secondary coil side of the TR is converted into, for example, DC 10 V, DC 100 A, or others, in the AC/DC converting circuit ACDC to be outputted. Here, the inverter device DCAC is configured of, for example, so-called H bridge circuit configured of four switch elements SW1a, SW1b, SW2a, SW2b and respective gate driver circuits GD thereof. In such a configuration example, by applying the above-described method of the present embodiment to the DCAC, the power supply device having the high reliability (the prevention of the false firing), and besides, the low loss can be achieved.

Figure 11A:
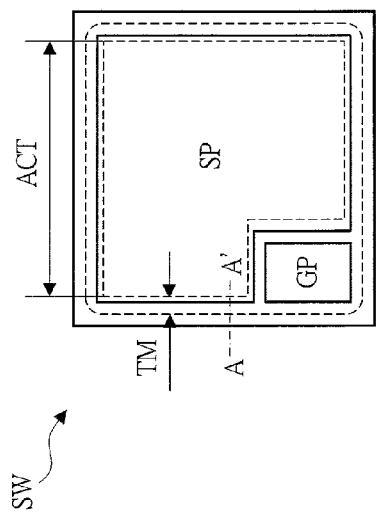
FIG. 11A is a plan view illustrating a schematic configuration example of a switch element of a power conversion device according to a fifth embodiment of the present invention.
Figure 11B:
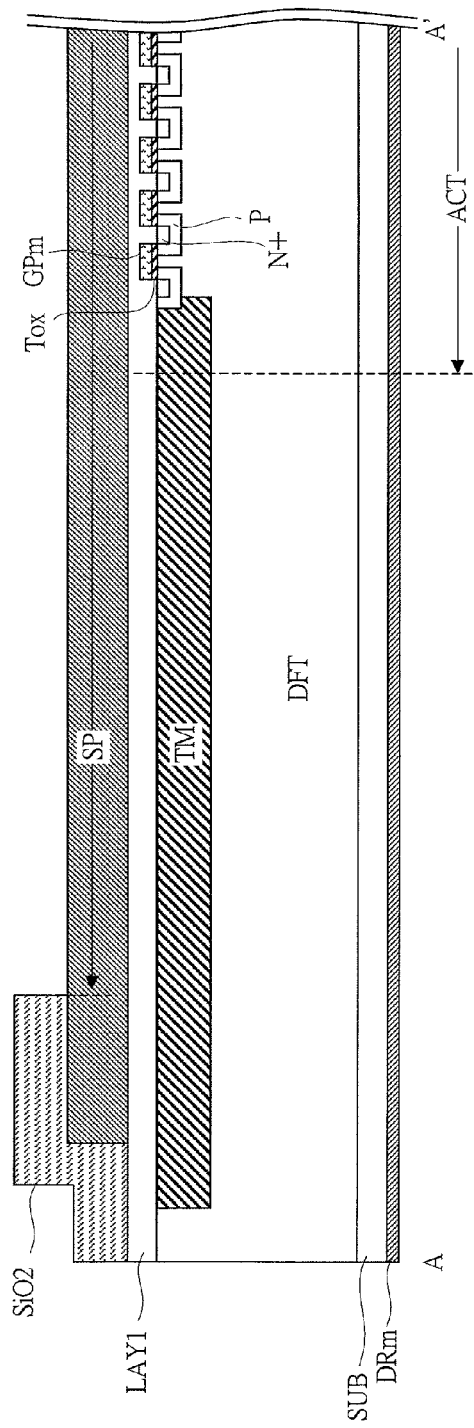
FIG. 11B is a cross-sectional view illustrating a schematic configuration example between A and A' in FIG. 11A.
Figure 13A:
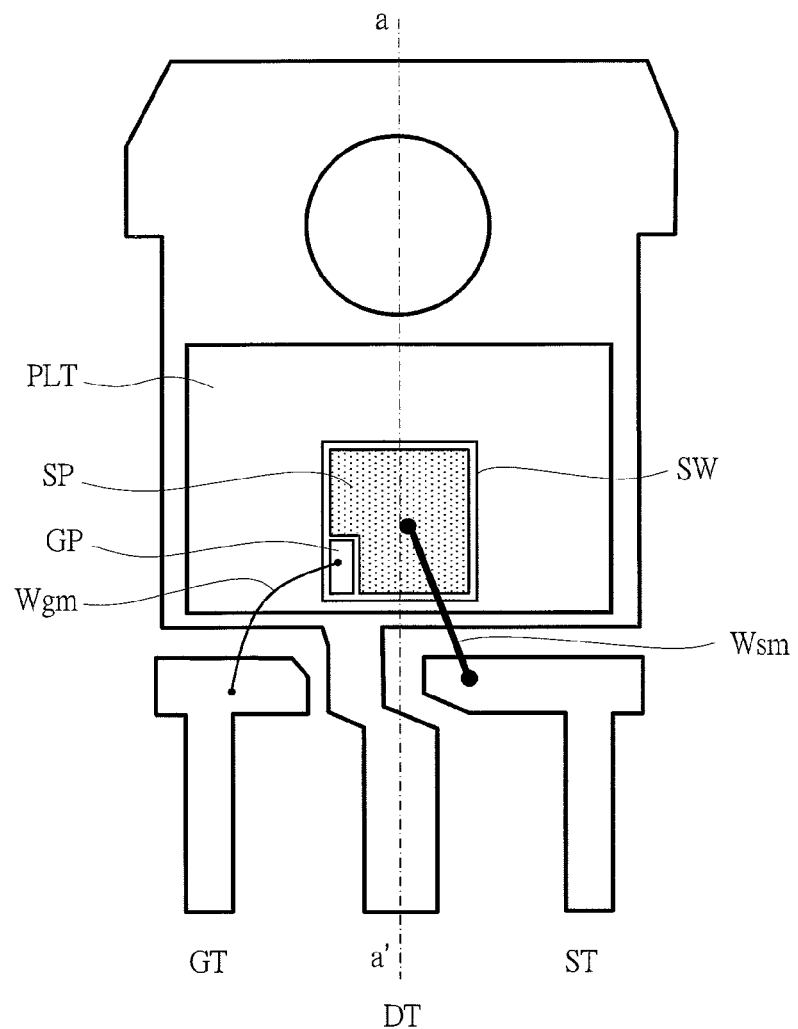
FIG. 13A is a diagram illustrating one example of a mounting mode of the switch element of FIG. 11A.

(Fifth Embodiment)
<<Details of Switch Element>>
FIG. 11A is a plan view illustrating a schematic configuration example of a switch element of a power conversion device according to a fifth embodiment of the present invention, and FIG. 11B is a cross-sectional view illustrating a schematic configuration example between A and A' in FIG. 11A. A switch element SW in FIG. 11A is configured of the SiCMOS. In FIG. 11A, a symbol "ACT" denotes an active element region, a symbol "TM" denotes a termination region, a symbol "GP" denotes a gate pad, and a symbol "SP" denotes a source pad. The TM is, for example, a p-type region, and plays a role of a function of relaxing electric field in an end surface. In FIG. 11A, a position of the gate pad GP can be freely arranged. Therefore, in a case of application to a mounting mode as illustrated in FIG. 13A described later, a length of wire bonding can be shortened.

Also, in FIG. 11B, in addition to each symbol of FIG. 11A, a symbol "DRm" denotes a drain electrode, a symbol "SUB" denotes a substrate, a symbol "DFT" denotes a drift layer, a symbol "SiO2" denotes a silicon oxide film, a symbol "Tox" denotes a gate insulating film, a symbol "GPm" denotes a gate electrode, a symbol "P" denotes a base layer, a symbol "N+" denotes a source layer, and a symbol "LAY1" denotes an interlayer insulting film. A plurality of element transistors each configured of the SiCMOS are formed inside the ACT, and are connected in parallel to be one switch element. That is, a plurality of N+ is connected in common to the source pad in a region not illustrated, and a plurality of GPms are also connected in common to the gate pad GP in the FIG. 11A in a region not illustrated. In FIG. 11B, by arranging the termination region TM in the periphery of the active element region ACT, the ACT can be sufficiently secured inside the chip, and therefore, there is an advantage that a large ON current can be achieved, that is, that a small ON resistance can be achieved.

Figure 12A:
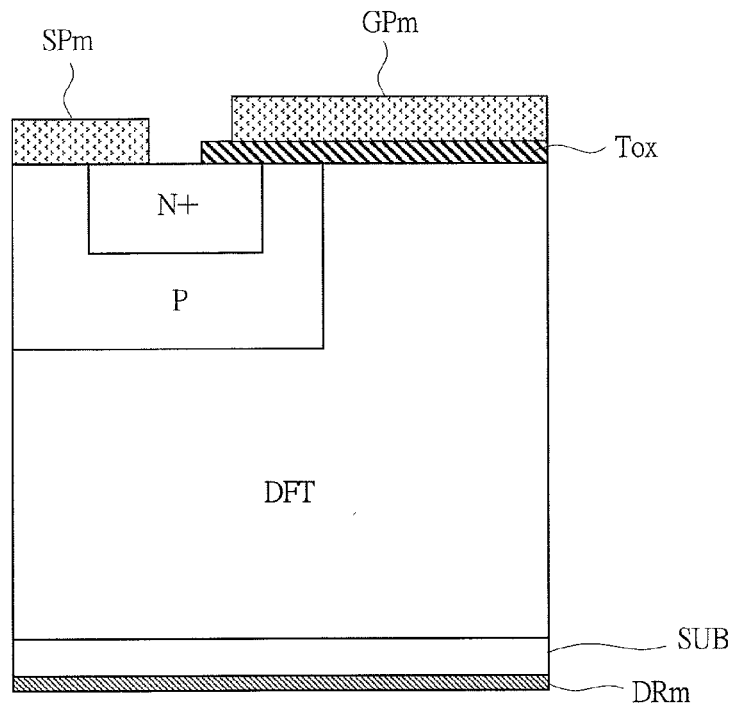
FIG. 12A is a cross-sectional view illustrating a configuration example of each element transistor inside an active element region in FIG. 11B.
Figure 12B:
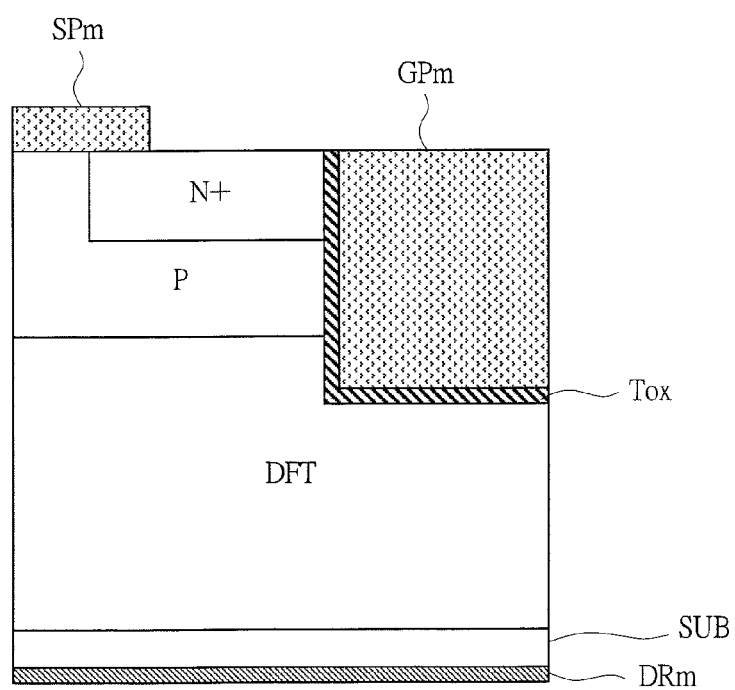
FIG. 12B is a cross-sectional view illustrating another configuration example of FIG. 12A.

FIG. 12A is a cross-sectional view illustrating a configuration example of each element transistor inside the active element region in FIG. 11B, and FIG. 12B is a cross-sectional view illustrating another configuration example of that of FIG. 12A. First, FIG. 12B illustrates one vertical SiCMOS having a trench structure. The source layer N+ to be an $n^+$-type region connected to the source electrode SPm is connected to the drift layer DFT via a channel formed inside the base layer P to be a p-type region. The DFT is, for example, an $n^-$-type region, and plays a role of securing a breakdown voltage. The substrate SUB is, for example, an $n^+$-type region, and the drain electrode DRm is connected to this SUB.

In such a trench structure, so-called JFET region which is an n-type semiconductor region sandwiched by the base layer P does not exist, and therefore, there is an advantage that the ON resistance of the entire SiCMOS can be decreased. In other words, by utilizing this structure in combination with the semiconductor driver circuit (the gate driver circuit and the gate driver control circuit) according to the present embodiment, a power conversion system whose loss is smaller can be achieved. On the other hand, FIG. 12A illustrates a SiCMOS of so-called DMOS (Double Diffusion Metal Oxide Semiconductor) type having no trench structure. In this case, there is an advantage that the device structure is simple and has a lower manufacturing cost than that of the SiCMOS of the trench structure type.

Figure 13B:
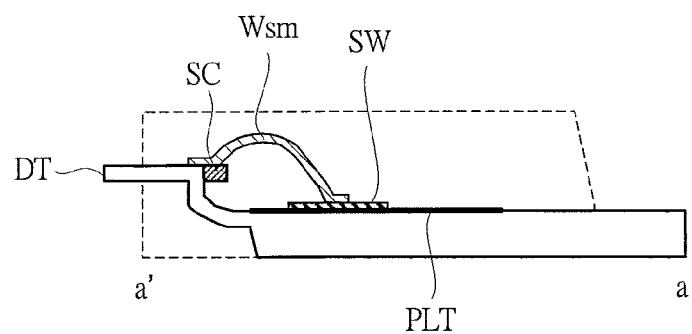
FIG. 13B is a cross-sectional view illustrating a configuration example between a and a' in FIG. 13A.
Figure 14:
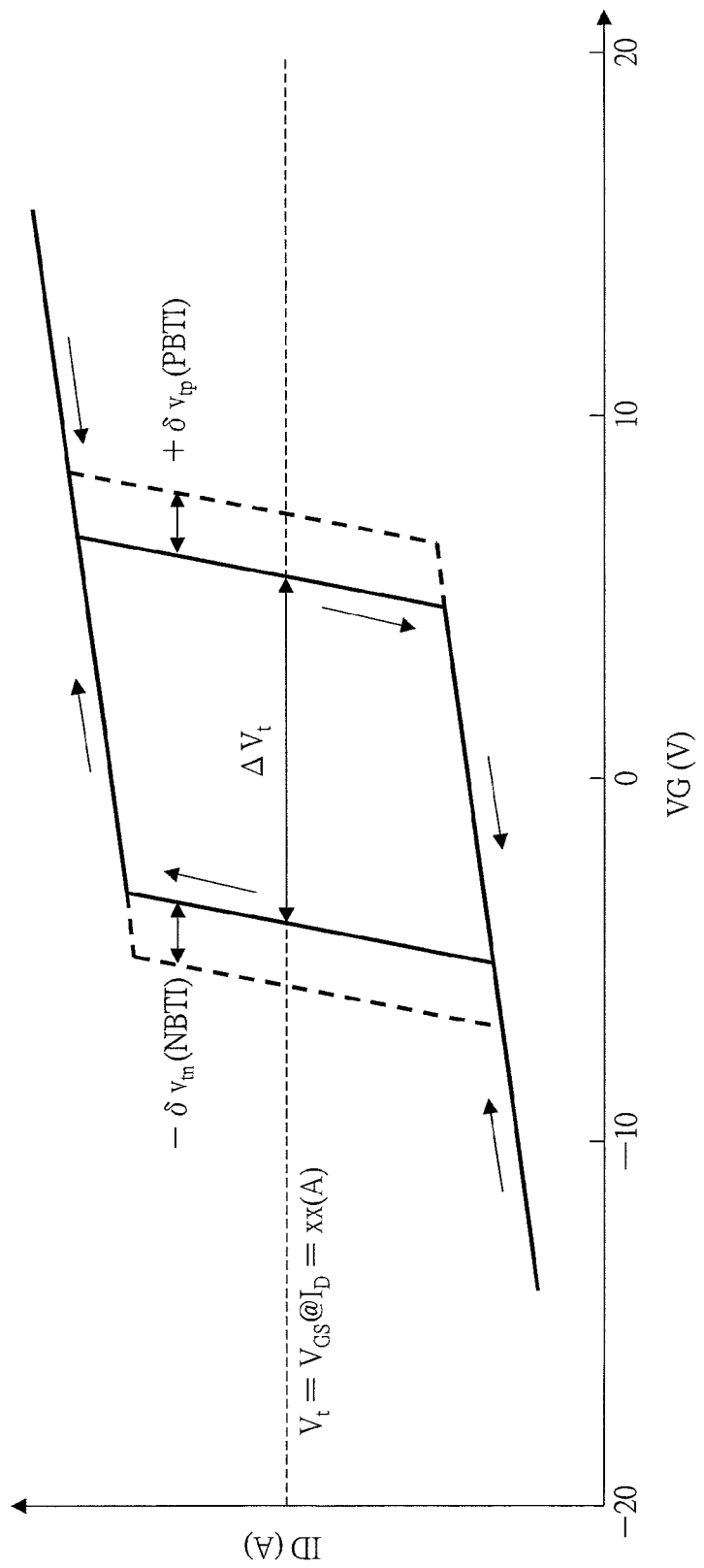
FIG. 14 is an explanatory diagram illustrating a characteristic example of a SiC MOSFET.

FIG. 13A is a diagram illustrating one example of the mounting mode of the switch element in FIG. 11A, and FIG. 13B is a cross-sectional view illustrating a configuration example between a-a' in FIG. 13A. In the example of FIGS. 13A and 13B, a switch element SW configured of the SiC-MOS is mounted on a metallic plate PLT inside a package. A drain electrode DRm (whose illustration is omitted) of the SW is connected to a drain terminal DT via the metallic plate PLT, and the source pad SP is connected to a source terminal ST and the gate pad GP is connected to a gate terminal GT by using bonding wires Wsm and Wgm or others, respectively. Note that FIG. 13B is illustrated on the assumption that a line a-a' goes along the Wsm, and besides, along the DT as a matter of convenience.

By applying such a chip arrangement and connecting configuration, a length of the bonding wire Wgm connected to the gate pad GP of the SiCMOS and a length of the bonding wire Wsm connected to the source pad SP thereof can be shortened. That is, parasitic inductances of the bonding wires and parasitic resistances (ON resistance components) due to the wires can be reduced. Therefore, the noises in the switching can be suppressed small, and an excess potential is not biased to the SiCMOS. Further, in the present embodiment, the chip is arranged on the flat, and therefore, a chip area of the SiCMOS can be freely designed. Therefore, designing of a low ON resistance and designing of an ON-current density are simplified, and power semiconductor chips having more various specifications can be achieved.

In the foregoing, the invention made by the present inventor has been concretely described based on the embodiments. However, it is needless to say that the present invention is not limited to the foregoing embodiments and various modifications can be made within the scope of the present invention.

That is, it goes without saying that various modifications can be made as long as preferred aims which prevents the false firing, reduces the degree of the shift of the threshold voltage in the conductive driving for long time, reduces the power loss, and others can be achieved. For example, the delay circuit DLY may be configured of a combined circuit obtained by appropriately modifying logic circuits. Moreover, while the example in which the negative potential is temporarily applied has been described here, it goes without saying that the gate potential can be temporarily boosted up to be higher than the power supply voltage VDD for the driving when the switch element is turned from the OFF state to the ON state. For example, a genera-purpose capacitor is utilized as a speed-up capacitor so that a speed of the gate driving is accelerated. In this manner, a speed of the turning ON can be increased so that the ON loss can be reduced. Further, since the temporal boost-up level applied to the gate is naturally returned to the power supply voltage VDD after completion of the turning-ON operation, the shifting of the threshold of the SiCMOS onto a high side can be also prevented.

Still further, for each switch element, a chemical-compound device made of not only silicon carbide (SiC) but also gallium nitride (GaN) or others may be used. It goes without saying that, when the chemical compound material is used for the switch element of the inverter device or others, the loss of the inverter device can be reduced by combination with the semiconductor driver circuits of the present embodiments. Still further, it goes without saying that, even when the power conversion devices of the present embodiments are applied to a power system for various intended purposes, the same effects can be obtained. Representatively, there are an inverter device of an air conditioner, a DC/DC converter of a server power supply, a power conditioner of a solar photovoltaic power generation system, an inverter device of hybrid/electric vehicles, and others.

Still further, here, the negative potential is applied by using a stabilized power supply such as a regulator circuit. However, while the stability is reduced, the negative potential can be also applied by using a switched capacitor method depending on cases. Even in this case, effects can be obtained to some extent as long as the configuration is made so that the negative potential is temporarily applied as illustrated in FIG. 2 and others.

What is claimed is:

1. A power conversion device comprising:
a first transistor switch inserted between a first power supply voltage and an output node;
a second transistor switch inserted between a second power supply voltage higher than the first power supply voltage and the output node; and
a first driver circuit for controlling turning ON/OFF of the first transistor switch, and,
when the first transistor switch is controlled to be turned OFF, the first driver circuit applying a first voltage between a gate and a source of the first transistor switch, and,
when the second transistor switch is shifted from the turning OFF to the turning ON at a first timing in a state that the first voltage is applied, the first driver circuit applying a second voltage lower than the first voltage between the gate and the source of the first transistor switch during a first period which crosses over the first timing, and the first driver circuit returning to apply the first voltage after passing the first period.

2. The power conversion device according to claim 1, wherein the first voltage is set at a level of 0 V, and the second voltage is set at a level of a negative voltage.

3. The power conversion device according to claim 2, wherein the second voltage is generated in a first regulator circuit.

4. The power conversion device according to claim 3, wherein the first driver circuit includes:
a pulse generating circuit which receives a control signal for shifting the second transistor switch from the turning OFF to the turning ON and which generates a pulse signal having a pulse width corresponding to the first period;
a first switch inserted between the first voltage and the gate of the first transistor switch; and
a second switch inserted between the second voltage and the gate of the first transistor switch, and complementary control of the turning ON/OFF of the first switch and the second switch is performed by using the pulse signal.

5. The power conversion device according to claim 3, wherein the power conversion device further includes:
a first resistor inserted in series to the first transistor switch between the first power supply voltage and the output node; and
a detecting circuit which detects a voltage generated in the first resistor and which outputs a detected signal on which a magnitude of the voltage is reflected, and
the first regulator circuit variably controls a magnitude of the second voltage in accordance with the detected signal.

6. The power conversion device according to claim 1, wherein the power conversion device further includes a second driver circuit for controlling the turning ON/OFF of the second transistor switch,
when the second transistor switch is controlled to be turned OFF, the second driver circuit applies a third voltage between a gate and a source of the second transistor switch, and,
when the first transistor switch is shifted from the turning OFF to the turning ON at a second timing in a state that the third voltage is applied, the second driver circuit applies a fourth voltage lower than the third voltage between the gate and the source of the second transistor switch during a second period which crosses over the second timing, and the second driver circuit returns to apply the third voltage after passing the second period.

7. The power conversion device according to claim 6, wherein the first voltage and the third voltage are set at a level of 0 V, and
the second voltage and the fourth voltage are set at a level of a negative voltage.

8. The power conversion device according to claim 7, wherein the second voltage is generated in a first regulator circuit, and
the fourth voltage is generated in a second regulator circuit.

9. The power conversion device according to claim 1, wherein the first transistor switch and the second transistor switch are made of silicon carbide.

10. A power conversion device comprising:
a first transistor switch inserted between a first power supply voltage and an output node with using the first power supply voltage side as a source;
a second transistor switch inserted between a second power supply voltage higher than the first power supply voltage and the output node with using the output node side as a source;
a first driver circuit for controlling turning ON/OFF of the first transistor switch;
a second driver circuit for controlling turning ON/OFF of the second transistor switch; and
a first voltage generating circuit,
the first voltage generating circuit generating a first voltage having a voltage level lower than the first power supply voltage,
the first driver circuit including:
a first pull-up switch inserted between a third power supply voltage higher than the first power supply voltage and a gate of the first transistor switch;
a first pull-down switch inserted between the first power supply voltage and the gate of the first transistor switch;
a second pull-down switch inserted between the first voltage and the gate of the first transistor switch; and a first pulse generating circuit which receives a first control signal for shifting the second transistor switch from the turning OFF to the turning ON and which generates a first pulse signal at an ON level in a first period, the first period being set so as to cross over a first timing at which the second transistor switch is shifted from the turning OFF to the turning ON, the first pull-down switch being driven so as to be turned ON when the first pulse signal is at an OFF level and be turned OFF when the first pulse signal is at an ON level, and the second pull-down switch being driven so as to be turned ON when the first pulse signal is at the ON level and be turned OFF when the first pulse signal is at the OFF level.

11. The power conversion device according to claim 10, wherein the first transistor switch and the second transistor switch are made of silicon carbide.

12. The power conversion device according to claim 11, wherein the power conversion device further includes a second voltage generating circuit for generating a second voltage having a voltage level lower than a source voltage of the second transistor switch, the second driver circuit includes:
a second pull-up switch inserted between a third voltage higher than the source voltage of the second transistor switch and a gate of the second transistor switch;
a third pull-down switch inserted between a source and the gate of the second transistor switch;
a fourth pull-down switch inserted between the second voltage and the gate of the second transistor switch; and
a second pulse generating circuit which receives a second control signal for shifting the first transistor switch from the turning OFF to the turning ON and which generates a second pulse signal at an ON level in a second period, the second period is set so as to cross over a second timing at which the first transistor switch is shifted from the turning OFF to the turning ON, the third pull-down switch is driven so as to be turned ON when the second pulse signal is at an OFF level and be turned OFF when the second pulse signal is at an ON level, and the fourth pull-down switch is driven so as to be turned ON when the second pulse signal is at the ON level and be turned OFF when the second pulse signal is at the OFF level.

13. A power conversion device comprising:
a semiconductor driver circuit, the semiconductor driver circuit including:
a first driver circuit for controlling turning ON/OFF of a first transistor switch inserted between a first power supply voltage and an output node as a target; and
a second driver circuit for controlling turning ON/OFF of a second transistor switch inserted between a second power supply voltage higher than the first power supply voltage and the output node as a target, and, when the first transistor switch is controlled to be turned OFF, the first driver circuit applying a first voltage between a gate and a source of the first transistor switch, and, when the second transistor switch is shifted from the turning OFF to the turning ON at a first timing in a state that the first voltage is applied, the first driver circuit applying a second voltage lower than the first voltage between the gate and the source of the first transistor switch during a first period which crosses over the first timing, and the first driver circuit returning to apply the first voltage after passing the first period.

14. The power conversion device according to claim 13, wherein the first voltage is set at a level of 0 V, and the second voltage is set at a level of a negative voltage.

15. The power conversion device according to claim 14, wherein the second voltage is generated in a first regulator circuit.

16. The power conversion device according to claim 15, wherein the first driver circuit includes:
a pulse generating circuit which receives a control signal for shifting the second transistor switch from the turning OFF to the turning ON and which generates a pulse signal having a pulse width corresponding to the first period;
a first switch inserted between the first voltage and the gate of the first transistor switch; and
a second switch inserted between the second voltage and the gate of the first transistor switch, and
complementary control of the turning ON/OFF of the first switch and the second switch is performed by using the pulse signal.

17. The power conversion device according to claim 13, wherein, when the second transistor switch is controlled to be turned OFF, the second driver circuit applies a third voltage between a gate and a source of the second transistor switch, and, when the first transistor switch is shifted from the turning OFF to the turning ON at a second timing in a state that the third voltage is applied, the second driver circuit applies a fourth voltage lower than the third voltage between the gate and the source of the second transistor switch during a second period which crosses over the second timing, and the second driver circuit returns to apply the third voltage after passing the second period.

18. The power conversion device according to claim 17, wherein the first voltage and the third voltage are set at a level of 0 V, and
the second voltage and the fourth voltage are set at a level of a negative voltage.

19. The power conversion device according to claim 18, wherein the second voltage is generated in a first regulator circuit, and
the fourth voltage is generated in a second regulator circuit.

20. The power conversion device according to claim 13, wherein the first transistor switch and the second transistor switch are made of silicon carbide.

* * * * *